(12) United States Patent
Suenaga

(10) Patent No.: US 6,924,514 B2
(45) Date of Patent: Aug. 2, 2005

(54) LIGHT-EMITTING DEVICE AND PROCESS FOR PRODUCING THEREOF

(75) Inventor: Ryoma Suenaga, Komatsushima (JP)

(73) Assignee: Nichia Corporation, Anan (JP)

( * ) Notice: Subject to any disclaimer, the term of this patent is extended or adjusted under 35 U.S.C. 154(b) by 70 days.

(21) Appl. No.: 10/368,015

(22) Filed: Feb. 19, 2003

(65) Prior Publication Data

US 2005/0072981 A1 Apr. 7, 2005

(30) Foreign Application Priority Data

Feb. 19, 2002 (JP) ........................................ 2002-041192

(51) Int. Cl.[7] .............................................. H01L 29/22
(52) U.S. Cl. ............................ 257/98; 257/99; 257/100
(58) Field of Search ............................. 257/98, 99, 100

(56) References Cited

U.S. PATENT DOCUMENTS

| 6,204,523 B1 | 3/2001 | Carey et al. |
| 6,274,924 B1 | 8/2001 | Carey et al. |
| 2003/0067264 A1 * | 4/2003 | Takekuma .................. 313/501 |

FOREIGN PATENT DOCUMENTS

| JP | 53-110371 A | 9/1978 |
| JP | 54-128278 A | 10/1979 |
| JP | 59-207645 A | 11/1984 |
| JP | 09-83018 A | 3/1997 |
| JP | 10-190065 A | 7/1998 |
| JP | 11-204841 A | 7/1999 |
| JP | 2000-150968 A | 5/2000 |

* cited by examiner

Primary Examiner—Sara Crane
(74) Attorney, Agent, or Firm—Smith Patent Office

(57) ABSTRACT

The light-emitting device includes a light-emitting element chip; a package having a first recessed portion thereon, in which the light-emitting chip is disposed; a transparent flexible member covering at least the recessed portion; and a transparent rigid member disposed on or above the transparent flexible member. The package has at least a first front surface extending at least outwardly above the first recessed portion; a second front surface extending outwardly above the first front surface; and a third surface as the outside of the package extending outwardly above the second front surface. The rigid member is disposed in the outline of the second front surface with at least three points of contact. The flexible member is continuously provided along the first front surface, the second front surface and the back surface of the rigid member. This light-emitting device is capable of improved reliability without deteriorating its optical characteristics.

28 Claims, 14 Drawing Sheets

LIGHT-EMITTING DEVICE AND PROCESS FOR PRODUCING THEREOF

BACKGROUND OF THE INVENTION

1. Field of the Invention

The present invention relates to a light-emitting device used for various light sources such as a backlight source, a display, illuminations, etc. or photo sensors, and more specifically to a light-emitting device with higher reliability and preferable optical characteristics.

2. Discussion of the Related Art

Recently, high-luminance, high-power semiconductor light-emitting elements, or small-scale and high sensitivity light-emitting devices have been developed and used in various fields. Such light-emitting devices have characteristics such as low power consumption, small-scale, lightweight, and therefore they are used as a light source for a light-printer head, a backlight source of liquid crystal display, light sources of various meters, various scanning sensors, etc.

FIG. 23 shows one example of a light-emitting device. A plastic package, which has a recessed portion, formed with integrally inserted lead terminals used for the light-emitting device. An LED chip is provided as a light-emitting element on the lead terminal. A bottom surface is exposed in the recess portion by die-bonding. Each of the terminals of the LED chip is electrically connected to the lead terminal by gold wires, etc. provided in the package. The LED chip provided in the recess portion is molded by a transparent member, which becomes rigid after curing. Consequently, the LED chip and the wires, etc. provided in the package can be protected from moisture, external forces, etc. in the environment. As a result, a highly reliable light-emitting device is achieved.

Since the light-emitting devices have become more widely used in various applications, they are now being used under more severe circumstances and conditions. For example, in applications for aircraft or automotive vehicles, the light-emitting devices are used even as high as +80 degrees Celsius or more, or as low as −20 degrees Celsius or less, depending on the outside air temperature. Further, they are subjected to outside air pressure, thermal shocks, as well as vibrations. In such cases, thermal stress makes each component repeatedly expand and contract. Therefore, their structural integrity deteriorates. Thus this arrangement has a negative influence on their optical characteristics and reduces their reliability. In addition, newly developed light-emitting elements, which can emit light in the near-ultraviolet range with high-luminosity, are now available. It is important for these lights to reduce deterioration of each element caused by light emission in the above ranges.

Recently, resin with a siloxane-coupling has received attention since it can prevent being cleaved by the light. The resin is impervious to the light in the above range and sufficient heat, and has a high flexibility.

While it has a high flexibility, its surface is soft, and thus its mechanical strength is low. Therefore, it is not suitable to use in an exterior member of a light-emitting device. Further, it has tackiness on its surface allowing foreign particles to be adhered thereon. Consequently, it is not suitable for a light-emitting surface.

Japanese Patent Laid-Open Publication Kokai No. 2000-150968 shows a light-emitting device that is composed of a package with a high thermal dissipation. A light-emitting element is provided on a metal base member and a rigid cover with a flexible light-resistant member is provided inside an opening wall, covering the light-emitting element. Such a light-emitting device having the above configuration is not only sufficiently impervious to light and heat, but also has sufficient mechanical strength against an external force.

However, when during the flexible member is covered by the rigid member as mentioned above, air bubbles tend to be mixed into the flexible member. Especially, if the flexible member is completely sealed by a rigid member such as metal, glass, or the like (which are not permeable to gas), the air bubbles reduce the thermal stability of the flexible member. Therefore, the flexible member cannot release thermal stresses and the rigid member in contact with the flexible member might be damaged. Furthermore, if the air bubbles were trapped at the interface between the flexible member and the rigid member, the air bubbles would peel these surfaces apart and then an air layer would be formed therein. This can cause a reduction in the light-emission power and a fluctuation in the optical characteristics of the device.

The present invention is devised to solve the above problems, and therefore, is aimed at providing a light-emitting device with a higher reliability and stable optical characteristics.

SUMMARY OF THE INVENTION

The light-emitting device of the invention includes a light-emitting element chip; a transparent flexible member covering the light-emitting element chip; a transparent rigid member having a front surface and a back surface disposed on or above the transparent flexible member. The back surface projects toward the light-emitting element chip.

When the light-emitting chip is molded in place by the flexible member and the rigid member is laminated thereon, air bubbles are prone to be mixed into the flexible member at the interface between them. The light-emitting device having air bubbles reduces its integrity because of a vapor burst by the air bubbles under high temperature. Therefore, such light-emitting devices cannot be soldered onto a mount substrate or the like, by a reflow mount and thus they are not appropriate for mass production. On the contrary, the light-emitting device of the present invention with its specific configuration of the rigid member solves these problems. Accordingly, the light-emitting device can have a higher reliability and is capable of a reflow mount, and is also ready for a Pb free mount.

Although the cross-sectional shape of the back surface is adequate to project toward the light-emitting element, it is not specifically so limited. It is preferable that the back shape has a proximate point between the bottom surface and the light-emitting element chip, which has at one point a shape such as V-shape. This shape can effectively reduce the mixing of air bubbles.

Further, it is preferable that the back surface has a curved surface. The curved surface can increase the flow velocity of the flexible member and thus it improves the efficiency of removing air bubbles, when the back surface with such a construction is applied with pressure toward the flexible member. Therefore, it is possible to effectively mass-produce a high reliability light-emitting device. In addition, such a construction achieves intimate contact with the back surface of the rigid member and the flexible member.

Furthermore, the back surface formed in a convex shape can reduce the overflow of the flexible member over the front surface of the rigid member.

In addition, the rigid member has a flange portion at a bottom end that extends outwardly and a side surface and the front surface of the flange portion are covered by the flexible member. By providing the flange portion mentioned above, it is easier to attach the rigid member. In addition, the flange portion can improve intimate contact with the flexible member and the reliability without any negative effects on its optical characteristics.

Furthermore, the light-emitting device further includes a package having a first recess portion thereon, in which the light-emitting chip is disposed, wherein the package has at least a first front surface extending at least outwardly over the first recessed portion; a second front surface extending outwardly over the first front surface; and a third surface as the outside of the package extending outwardly over the second front surface wherein the flexible member is continuously provided among the first front surface, the second front surface, and the bottom end portion of the rigid member. Thus, this design retains integration of each member without an additional adhesive, and a high reliability light-emitting device is accordingly provided. Otherwise, in the case where each member was adhered using even a small amount of adhesive or the like, the adhesive would deteriorate locally and reduce the reliability because of heat or light. In contrast, the above-mentioned construction can prevent the local deterioration, and provide the light-emitting device with a longer-life.

Furthermore, it is preferable for the second front surface to include front surfaces of at least three supporting base members provided spaced apart above the first front surface. The back surface of the rigid member is in contact with the second front surface. By employing such a configuration, even if peeling occurs between the rigid member and the flexible member in use under severe conditions or requirements, this structure can still control the peeling portion to be retained around the supporting base members, and thus it can maintain its optical characteristics.

It is preferable that the rigid member is located in the outline profile of the second front surface with at least three points of contact. The first front surface and the second front surface have an exposed portion at an outer area between the respective points of contact in the rigid member. The light-emitting device with this configuration can position the second front surface with accuracy with the aid of pressure. The pressure is applied when disposing the rigid member onto the flexible member. The pressure also removes mixed air bubbles in the flexible member or at the interface between the flexible member and the rigid member and leads them outside by action between the rigid member and the exposed portions of the first front surface. Accordingly this structure provides the light-emitting device with a higher reliability and optical stability with an enhanced yield by employing a simple method. The surface of the applied flexible member before curing usually has a convex shape that faces upwardly by surface tension. Applying pressure to the convex shape portion by the back surface and flowing the flexible member by the package recess portion can achieve the effect of removing air bubbles in the whole flexible member. In addition, the light-emitting device of the present invention is integrated with the rigid member and this aids the overflow of the flexible member when the effect of removing air bubbles is achieved. Additionally, it is preferable that the front surface of the rigid member has a curved shape projecting away from the back surface. Thus, the emission surface with such shape can collect the light reflect-scattered by the inner wall of the recess portion to improve luminance in the front direction. Especially, when the back surface has a curved shape projecting toward the recess portion mentioned above, the diffused incident light comes into the rigid member, it is preferable that the front surface has a curved surface projecting away from the back surface in order to collect the light.

Furthermore, it is preferable that the rigid member has a flange portion at a bottom end extending outwardly with the side surface and the front surface of the flange portion being covered by the flexible member It is also preferable that the back surface of the flange portion is parallel with, and faces the second front surface. Thereby this structure improves the accuracy of positioning the rigid member and the second front surface and thus dispersion of the optical axis can be reduced. This also provides a reliable light-emitting device by mass production.

Furthermore, the outline of the second front surface is a polygonal shape with more vertexes than the outline of the rigid member. This structure provides a small light-emitting device capable of high-density mounting.

Additionally, the outline of the rigid member is rounded at points of contact to increase the speed of overflowing the flexible member onto the second front surface. Thus, the rigid member can be fixed thereto quickly. In addition, the stress applied to the flexible member can be increased. Therefore this improves the effect of removing air bubbles, thereby improving reliability. Additionally, the flexible member provided from the second front surface to the lower end portion of the rigid member can have a smooth and flat front surface. Moreover, when the above-mentioned one point is a center part in the second front surface, the bubbles can be efficiently prevented from being mixed in the entire interface.

Furthermore, the exposed portion of the first front surface projects outwardly from the middle area. This configuration of its shape allows the flexible member to effectively flow toward the second front surface and the lower end portion of the rigid member. Moreover, as pressure is applied on the wall of the projecting portion, defoaming or degassing in the flexible member is accelerated. The projecting portion facing the corner of the second front surface forms the flexible member with a uniform thickness on the exposed portion of the second front surface and thus it reinforces the structural integrity. In addition, integrity is further enhanced if the edges of the end of the projecting portions are rounded.

If the package is integrally formed by mold resin with a pair of lead terminals inserted from a side surface, it is preferable for an inner portion of the lead terminal to be exposed along the outline of the first front surface. Because the surface of the lead terminal is made of metal, it has a superior fluidity for the flexible member. While this invention achieves a higher reliability by flowing the flexible member upwardly by counteraction due to a collision on each sidewall of the package, it would further accelerate the air bubbles defoaming if the lead terminal was provided on the sidewall where inverted movement of the flexible member by collision occurs, since the moving speed of the flexible member by collision with sidewall is accelerated.

Also, it is preferable that the inner portion of the lead terminal is inwardly separated from the exposed portion of the first front surface into two directions, thereby the above-mentioned effect is further improved. In addition, this prevents the integrally formed lead terminal from dropping off. Additionally, in case another element such as a protector element is also provided, it is preferable to provide it between the separated branch leads with an electrical connection, since the element is located at a position with no interference with the observed light-emission.

Furthermore, it is preferable that a part of the back surface of the lead terminal is exposed in a small hole penetrated from the back surface side of the package to release the stress on the lead terminal during wire-bonding or when providing the rigid member. This improves the structural integrity between the lead terminal and the other members.

Furthermore, it is preferable that the package has a metal base member, the back surface of which is a mount surface. The front surface of the metal base member is exposed from the bottom surface of the recess portion. The light-emitting element is disposed on the front surface of the metal base member. Therefore, the heat generated from the light-emitting element can be effectively dissipated to the mount board thereby improving the reliability of the flexible member covering the light-emitting element. In addition, the flowability of the lower flexible member at the surface of the metal base member is improved, so that local deterioration near the light-emitting element can be prevented.

It is also preferable that the metal base member is formed with lead terminals into one body by mold resin. One end of the metal base member projects from the side of the package to increase contact area between the metal base member and the outside air, so that the thermal dissipation of the light-emitting device can be improved.

Furthermore, it is preferable that the metal base member has a first front surface exposed in the recessed portion, and a second front surface covered in the package to improve the structural integrity of the light-emitting device.

Furthermore, if a second recessed portion is provided substantially in the center of the front surface of the metal base member exposed in the bottom surface of the recessed portion, arid the light-emitting element is disposed on the bottom surface of the second recessed portion, then outgoing efficiency of light is increased. It can also prevent mixing air bubbles in the flexible member, and further it can improve the effect of removing air bubbles and improve the flowability of the flexible member nearby the light-emitting element. In addition, the second recessed portion can increase the contact area between the flexible member and the metal base member. This increases the length of the path of thermal dissipation so that local deterioration of the flexible member can be prevented.

It is also preferable that one end portion of each of the pair of lead terminals is exposed from the side surface opposite from the side where one end portion of the metal base member is exposed. It is also preferable to align these end portions in parallel at a predetermined distance apart. This allows the terminals of the mount board to be easily wired. In addition, this allows the light-emitting device to be downsized while maintaining the area of the back surface of the metal base member. Furthermore, the back surface of the package has a notch portion opening at the edge facing the metal base member. It can trap the flow of a conducting member toward the lead terminal by the notch portion. This prevents the electrical flow from reaching the opposite lead terminal, even when the conducting member provided on the back surface of the metal base member is too much. Therefore this arrangement can improve yields.

Furthermore, in the case where the light-emitting element has a pair of positive and negative terminals in the same side that are preferably coplanar, the pair of terminals is connected by wires. In this arrangement, it would be advantageous that the top points of the wires are positioned between the first front surface and the second front surface. Providing the wires in this position improves flowability of the flexible member, and minimizes the deleterious effects of thermal stress on the wires. In addition, since the lead terminal is provided above each terminal of the light-emitting element, and no impediments exist in the path from the light-emitting element to the lead terminal, wire-bonding can be performed relatively easily with a higher reliability.

The process for producing a light-emitting device according to the present invention relates to the light-emitting device having a package with a recess portion thereon, in which the light-emitting chip is disposed, a transparent flexible member covering at least the recess portion, a transparent rigid member disposed on or above the flexible member, and a path opening continuously from the bottom surface to the top of the package. This process includes a first step of injecting the transparent flexible member into the recess portion in the package to cover the light-emitting element provided in the recess portion; a second step of pressing the rigid member downwardly to overflow the transparent flexible member over the top surface of the end portion of the transparent rigid member through the path; and a third step of heating to structurally form each member into one body. Consequently, this process produces a light-emitting device with a higher reliability and good optical stability by employing a high yield simplified method.

In the light-emitting device of the present invention, a light-emitting element is molded with a flexible first covering member and a rigid second member, by providing a continuously open path from the bottom surface to the top of the package which reduces the mixing of air bubbles between the flexible member and the rigid member, and also improves the effect of removing air bubbles mixed in the flexible member.

The above and further objects and features of the invention will more fully be apparent from the following detailed description with the accompanying drawings.

DETAILED DESCRIPTION OF THE PREFERRED EMBODIMENTS

The inventors of the present invention found that specific shapes of a rigid member could solve the problems mentioned above when covering a light-emitting element chip 2 by a flexible member 3 and a rigid member 4. The following description will describe the embodiments of the present invention in detail.

Package 1

Figure 1:
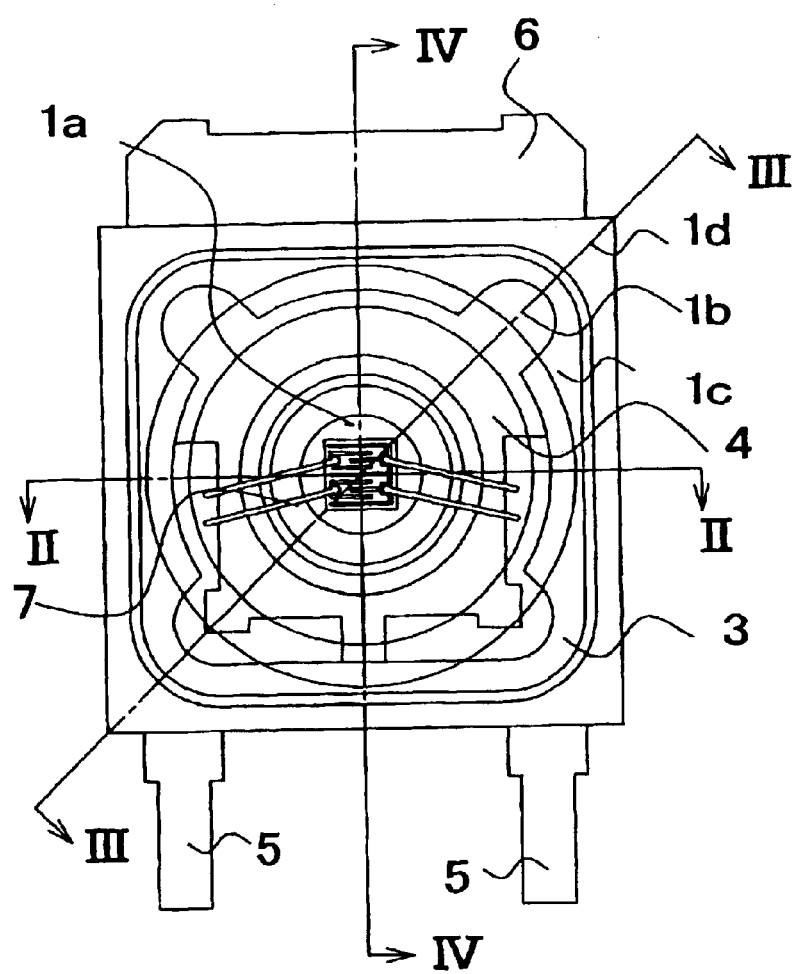
FIG. 1 shows a plan view of a light-emitting device according to the present invention.
Figure 2:
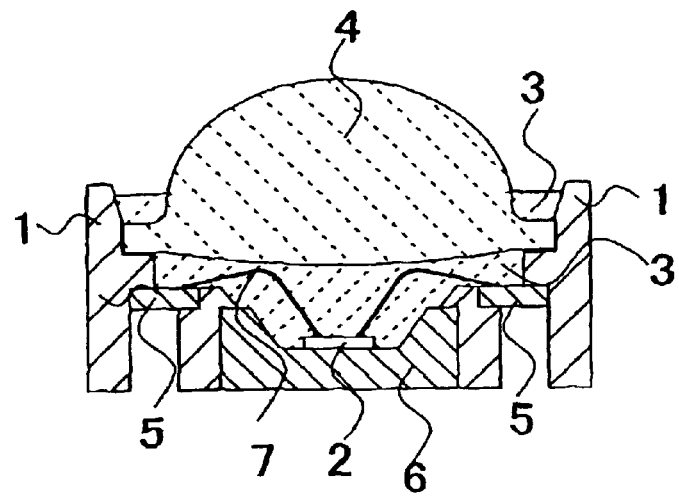
FIG. 2 shows a cross-sectional view taken along line II—II in FIG. 1.
Figure 3:
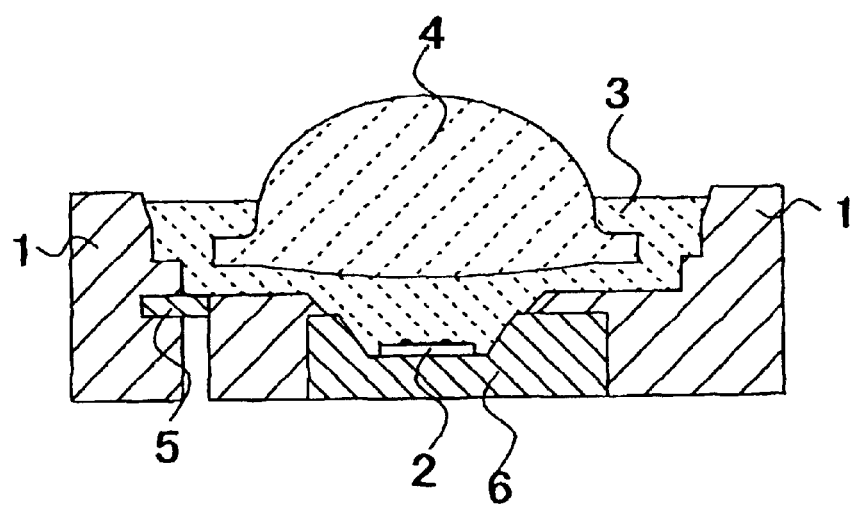
FIG. 3 shows a cross-sectional view taken along line III—III in FIG. 1.

A package 1 which is shown, for example in FIG. 1, is formed by curing. The curing occurs after melted molding resin is injected into a closed mold, into which positive and negative terminals 5 and a metal base member 6 (acting as a heat sink) have been inserted from the opposite side surfaces respectively, through a gate in the bottom side.

More specifically, the package 1 has a first recessed portion in a front surface side. A front surface of the metal base member 6, inserted from one side surface of the package 1, is exposed in the first recessed portion. A second recessed portion 1a capable of mounting a light-emitting element 2 is provided on the front surface of the metal base member 6.

A first front surface 1b extending outwardly is provided above the first recessed portion. Also a second front surface 1c extending outwardly is provided above the first front surface 1b. Front surfaces of a pair of positive and negative lead terminals 5, which have been inserted from another side surface opposite to the one side surface of the package 1, are exposed in the first front surface. Wires 7 electrically connect the front surfaces of the leads terminals 5 and the terminals of the light-emitting element 2, respectively. Further, the second front surface 1c plays a role in positioning the rigid member 4 disposed on or above this surface.

The light-emitting device of the invention is configured by employing the package 1 having the above construction. The light-emitting element 2 is electrically connected to the bottom surface of the recess 1a. The flexible member 3 is a first covering member and the rigid member 4 is a second covering member which are molded together to seal the device.

Figure 16:
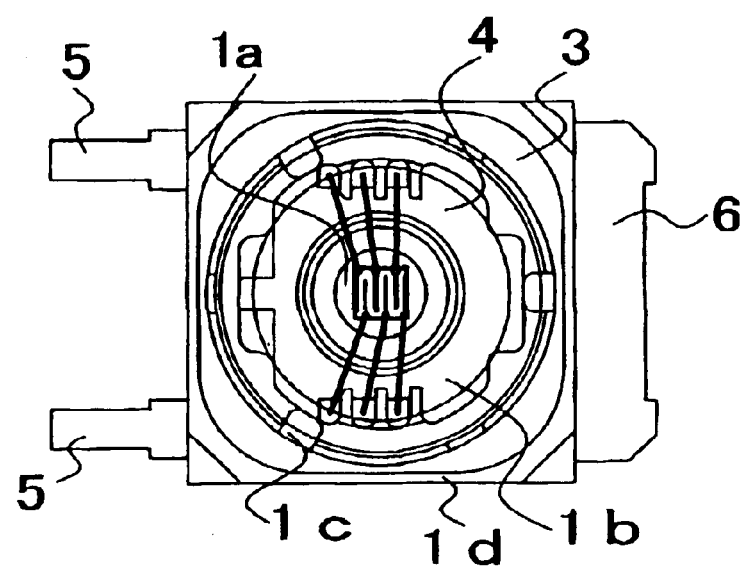
FIG. 16 shows a plan view of another light-emitting device according to the present invention.

It is sufficient that the front surface of the lead terminal 5 disposed in the first recess portion has a sufficient area necessary to bond the conductive wire to each terminal of the light-emitting terminal. It is preferable that the other part of the front surface of the lead terminal 5 be covered by the same material as the package resin as shown in FIG. 16. This reduces the expansion of vaporization evolved at the interface between the lead terminal 5 and the first covering member 3. Further, widening the area for contact between the relatively high intimate contact mold resin of the package 1 and the molding member can force integration of the light-emitting device. Thus the resulting light-emitting device has preferable optical characteristics and a higher reliability.

The package 1 of this embodiment has a shape which allows the first front surface and the second front surface (outwardly from the second covering member) to be partially exposed. In this embodiment, the second front surface has a wall, which is formed in a corner-rounded rectangular shape. The second covering member of a circular outline profile is disposed in this rectangular shape. Both the second front surface 1c and the four corner portions of the first front surface are exposed at four points outside the second covering member 4. As mentioned above, a continuous path is defined as opening from the bottom surface to the top of the package 1 without being closed by the rigid member 4. Thus, air bubbles are pushed away from the flexible member 3 through the continuous path, when the rigid member 4 is put onto the package 1 after the flexible member 3 has been added to the package 1. Therefore, this arrangement can reduce trapping of air bubbles between the rigid member 4 and the flexible member 3. Especially, in this embodiment, the exposed portion of the first front surface 1b has a convex shape projecting from its center portion. It improves the effect of removing air bubbles by collisions at the outline of the convex shape. While it has been described that the package 1 is formed with the path opening through the embodiment, the invention is not limited to this configuration. For example, it is possible to achieve a similar result by forming a notch at the edge portion of the lens.

Lead Terminal 5

The lead terminal 5 may be made of a high thermal conductivity material such as copper or alloys of copper with iron, etc. Further, the surface of the lead terminal 5 can be plated by a metal such as silver, aluminum, copper, or gold, to improve the reflectivity of the light from light-emitting element 2, and to prevent oxidation of the lead base material. It is preferable that the lead terminal 5 has a substantially smooth surface to improve its reflectivity. Furthermore, it is preferable that the lead terminal 5 has a surface with a larger area to improve thermal dissipation so that it effectively reduces the temperature rise of the light-emitting element chip 2. Thus, relatively high electric power can be applied to the light-emitting element chip 2, so as to increase the light-emission power.

The lead terminal 5 may be formed by a press stamping long metal plates. For example, these plates can be made of a copper alloy with 0.15 mm thickness. In this embodiment, the positive terminal 5 and the negative terminal 5 are stamped to align both of them in one direction.

In the light-emitting device of the present invention, it is preferable that the corner between the back surface and the side surface of the lead terminal 5 is rounded. Forming the rounded end portion of lead terminal facing toward the direction of injecting the resin makes the mold resin flow smoothly so that it improves intimate contact between the lead terminal 5 and the mold resin member 1. In addition, this allows resin to fill the space between the pair of lead terminals 5 exposed in the bottom surface of the package.

Furthermore, the seam line between the mold resin member and the lead terminal 5 is formed in a shape corresponding to the lead terminal 5. Thus, it is possible to make the angle at the bottom between the seam line on the side surface of the mold resin member and the back surface, a rounded concave shape. Therefore, this structure avoids stress concentrations at the seal line, so that it can reduce the occurrence of cracks in the package.

Further, it is preferable that the angle formed between the front surface and the side surface of the lead terminal 5 is an acute angle. This angle improves intimate contact between the lead terminal 5 and the first mold member 3 so that it reduces peeling at these interfaces.

Furthermore, the back surfaces of outer lead portions of the positive terminal 5 and the negative terminal 5 projecting from the outer shell of the package body are formed in a gull-wing shape so their back surfaces are set back with respect to the back surface of the mold resin member and the back surface of the metal base member. The outer lead portions of the positive and negative terminals 5 are positive and negative terminal 5 connectors, respectively. In addition, the structure of the terminal connectors is not limited to the gull-wing shape, and it may be formed in the other structure such as a J-bend, etc.

Metal Base Member 6

The package 1 used in the light-emitting device of the invention has the metal base member 6 mounting the light-emitting element 2 in its center, and is capable of high thermal dissipation of heat generated from the light-emitting element 2. The metal base member 6 has the recessed portion 1a in the front surface side. The back surface of the metal base member 6 is positioned substantially coplanar with the mount surface of the light-emitting device. Namely the back surface of the terminal connector of the lead terminal 5, and the back surface of the mold resin member, to be in contact with a mount board are coplanar. According to the structure of the present invention, heat generated from the light-emitting element 2 can be dissipated to the mount board directly and therefore, the amount of the current applied to the light-emitting element 2 can be increased, so that the light power can be increased. The thickness of the bottom surface of the recessed portion is formed in a thin layer to perform higher thermal dissipation. It is preferable that the recess portion is defined in the center of the light-emitting device to achieve the proper direction for the light.

Further, it is preferable that the recessed portion has a capacity to mount the whole light-emitting element 2. This allows the light emitted from the four side surfaces of the light-emitting element 2 to be reflected toward a front direction from the inner wall of the recessed portion. Furthermore, it is possible to convert the wavelength of the light-emitting element 2 by using a color-converting layer. The color-converting layer may easily cover the whole light-emitting element 2 provided in the recess portion. The color-converting layer has a transparent material and a fluorescent material capable of partially absorbing the light emitted from the light-emitting element 2 and of emitting light with a different wavelength. Especially for the metal package used in the invention, the recess portion containing the light-emitting element 2 has a higher thermal dissipation, so that each material of the color-converting layer may include not only an inorganic substance but also an organic substance. The deterioration of the organic substance caused by applying a high current hardly occurs with this design so the light-emitting device retains its preferable optical characteristics. In addition, it is preferable that the inner wall of the recessed portion is formed in a tapered shape, where its capacity is increased toward the opening side to achieve a higher intensity emission by the light-emitting device.

The recessed portion can be formed in the metal plate, for example. In one embodiment, the recessed portion is formed in the metal plate by pressing on the front surface toward the back surface. Thus, the outline profile of the back surface has irregularities and the area in contact with the mold resin member is increased and consequently it reinforces structural integrity.

It is preferable that the lead terminal 5 and the metal base member 6 each have a thermal conductivity between and including 10 W/m·K to 100 W/m·K It is more preferable that they have between and including 15 W/m·K to 80 W/m·K. It is the most preferable that they have between and including 15 W/m·K to 50 W/m·K to obtain a light-emitting device capable of applying a higher current for a longer time and maintain reliability.

Light-Emitting Element 2

The light-emitting element chip 2 used in the present invention is not specifically limited to the case where the pair of lead terminals 5 and the metal base member 6 are molded together by mold resin using an insert-molding process with the pair of positive and negative terminals being on the same side. Further, in the case where the device includes a fluorescent material, a semiconductor light-emitting element having a light-emitting layer capable of emitting the light with a wavelength that can excite the fluorescent material is preferable.

While various semiconductors, such as ZnSe or GaN, can be used as the semiconductor light-emitting element, a nitride semiconductor ($In_XAl_YGa_{1-X-Y}N$, where $0 \leq X$, $0 \leq Y$, $0 \leq X+Y \leq 1$.) capable of emitting light with a short wavelength that can excite the fluorescent material efficiently is preferably chosen. Furthermore, the nitride semiconductor can include boron or phosphorus, if desired. The structure of the semiconductor may be a MIS junction, a PIN junction, a homo-structure, a hetero-structure, or a double-hetero-structure with a p-n junction, etc. Various wavelengths of light-emission can be selected corresponding to the materials and mixture ratios of the semiconductor.

Also a single-quantum structure or a multi-quantum-structure formed in thin layers to have a quantum effect as the semiconductor active layer is applicable. In case a nitride semiconductor is used, the preferable materials for the substrate for the semiconductor include sapphire, spinel, SiC, Si, ZnO, GaN, or the like. To mass-produce the nitride semiconductors with superior crystallinity, a sapphire substrate is the most preferable. The nitride semiconductor can be deposited on the sapphire substrate by a MOCVD method or the like.

A buffer layer such as GaN, AlN, GaAlN, can also be formed on the sapphire substrate. The nitride semiconductor with a p-n junction may be formed thereon. As one example of the light-emitting element 2 of the nitride semiconductor with a p-n junction, the double-hetero-structure is constructed with a first contact layer of n-type gallium nitride formed on the buffer layer, a first cladding layer of n-type aluminum-gallium nitride, the active layer of indium-gallium nitride, a second cladding layer of p-type aluminum-gallium nitride, and a second contact layer of p-type gallium nitride, all being successively deposited. The nitride semi-conductor shows n-type conductivity without doping impurities. It is preferable to dope with an n-type dopant such as Si, Se, Ge, Te, and C to form a desired n-type nitride semiconductor for the purpose of improving the efficiency of the light-emission as well as other reasons.

On the other hand, when the desired p-type nitride semiconductor is formed Zn, Mg, Be, Ca, Sr, Ba, etc. may be doped as p-type dopants. Since it is difficult to make a nitride semiconductor be a p-type semiconductor even by doping p-type dopant, it is preferable to use a low-resistance process such as annealing in a chamber or furnace or plasma radiation. In addition, after depositing a metal layer on the p-type layer, the substrate of the semiconductor may be removed.

This light-emitting element manufactured as described above may be mounted on the metal layer facing the mount side to improve thermal dissipation of the light-emitting device. After the terminals are formed on the exposed p-type layer and the n-type layer, the semiconductor wafer is cut into chips and thus the nitride semiconductor light-emitting element 2 is obtained.

In the light-emitting diode according to the present invention, to emit whitish light, in view of relationship of complementary color with wavelength of light from the fluorescent material, deterioration of the transparent resin, or the like, it is preferable that the wavelength of the light-emitting element 2 is 400–490 nm and more preferably 420–490 nm. To further improve excitation of the light-emitting element 2 and the fluorescent material as well as efficiency of light-emission, 450–475 nm are the most preferable wavelengths.

In the present invention, since the light-emitting element 2 is reliably molded and sealed by the first mold member 3, which is flexible and impervious to the light, possible local deterioration of component caused by near-ultraviolet or ultraviolet rays can be reduced. Accordingly, combining a light-emitting element 2 with a main wavelength of less than 400 nm in the ultraviolet range, and a fluorescent material capable of absorbing a portion of the light emitted from the light-emitting element 2 and of emitting light with a different wavelength can provide a color-converting type light-emitting device with a lower color variation. When binding the fluorescent material on the light-emitting chip 2, it is preferable to employ a resin relatively impervious to ultraviolet rays, or glass as an inorganic substance, or the like.

A gallium nitride semiconductor element capable of emitting blue light can be employed as the light-emitting element 2. For example, this element has nitride semiconductor layers, which include the n-type layer, the active layer, and the p-type layer, formed on a sapphire substrate; the n-terminal formed on a partially exposed n-type layer by removing the active layer and the p-type layer; and a p-terminal formed on the p-type layer.

Flexible Member 3

The flexible member 3 is provided from a recessed portion of the package 1 to the bottom end portion of the rigid member 4 filling upwardly to cover the light-emitting element 2. The flexible member 3 protects the light-emitting element 1 against moisture, etc., and is transparent so as to effectively lead light out through it. Further, since the flexible member is highly stable against heat, it relaxes thermal stress occurring when operating the light-emitting device. When using a near-ultraviolet or ultraviolet light-emitting device, a light hardened flexible member 3 is preferable. For example, a rubbery flexible resin, a gel-resin, etc. are applicable as the flexible member 3. Since these kinds of resins have a low bridge density, or do not have a bridged bond, the desired flexibility is achieved. Also, colored dye(s) or colored pigment(s) may be added so as to act as a filter for particular light wavelengths emitted from the light-emitting element 2.

Rigid Member 4

In the light-emitting device of the present invention, the rigid member 4 covers the flexible member 3 provided around the light-emitting element 2. The rigid member 4 is not limited to a particular material as long as it has sufficient mechanical strength and is transparent.

In one embodiment, the rigid member 4 serves as a light outgoing window component and is disposed above the light-emitting element 2 mounted in the recessed portion of the metal package. An elongated inner wall constituting the recess surrounds the rigid member 4.

The rigid member 4 is also conducive to light-emission. The light emitted from the edge portion of the light-emitting element 2 is reflected and scattered on the side surface of the recess portion in the flexible member 3, and then it passes through the rigid member 4 and then goes out toward the front. Almost all of the reflected and scattered light should run inside of the boundary of the elongated side surface of the recess. Accordingly, the inner area surrounding the points of intersection with the rigid member 4 can be adjusted in an adequate shape so as to provide the light-emitting device with a desired luminance. A base material for the rigid member 4 preferably has a similar thermal expansion coefficient as the mold resin forming the main body of the package 1 and the flexible member 3 provided under the rigid member 4.

The rigid member 4 is preferably formed to have a continuous back surface shape such that it does not allow air bubbles to trap at the interface with the flexible member 3. Thus the rigid member 4 can be reliably disposed. Further, a flange portion is provided around the outline edge of the back surface make the rigid member 4 positioning more reliable. It is preferable for the flange portion to be provided outside of the boundary of the elongation of the side surface of the recessed portion disposing the light-emitting element 2 inside in order to improve reliability without affecting optical characteristics.

In the meantime, the front surface preferably has a curved surface projecting in the center portion inside of the recessed portion side surface elongation. By this configuration, the light scattered in the back side can be converged toward the front effectively, and the luminous intensity in the front direction can be increased.

In the present invention, the rigid member 4 is disposed in the outline of the second front surface, and is integrally formed with each member structurally by the flexible member 3 that overflows through a path opening continuously from a bottom surface to the top of the package 1. The front side surface or the back side surface of the rigid member 4 may include a colored dye or a colored pigment in order to perform as a filter against a particular wavelength of light from the light-emitting element 2.

Fluorescent Material 8

In the present invention, other materials such as a fluorescent material 8 may be added to the flexible member 3, the rigid member 4 or others. The fluorescent material 8 used in the embodiment will be described below.

In the present invention, various types of fluorescent materials 8 such as an inorganic fluorescent substance or an organic fluorescent substance may be added to the each component member. For example, a fluorescent material 8 containing a rare-earth element, which is an inorganic fluorescent substance is applicable as a fluorescent material 8. Specifically, a garnet fluorescent material 8, which includes at least one element selected from the group consisting of Y, Lu, Sc, La, Gd, and Sm, and at least one element selected from the group consisting of Al, Ga, and In, is one example of a fluorescent material 8 with a rare-earth element. More specifically yttrium-aluminum-oxide based fluorescent material 8 activated with cerium is preferable, and optionally, Tb, Cu, Ag, Au, Fe, Cr, Nd, Dy, Ni, Ti, Eu, Pr, etc. may be further added to Ce if desired.

The light-emitting device of the embodiment employs a fluorescent material 8 based on a yttrium-aluminum-oxide fluorescent material 8 activated with cerium, which can light up by being excited by the light emitted from the semiconductor light-emitting element 2 with the light-emitting layer of the nitride semiconductor.

Specific materials include yttrium-aluminum-oxide based fluorescent material 8, $YAlO_3$:Ce, $Y_3Al_5O_{12}$:Ce (YAG:Ce), $Y_4Al_2O_9$:Ce, or mixtures thereof. The yttrium-aluminum-oxide based fluorescent material 8 may include at least one element selected from the group consisting of Ba, Sr, Mg, Ca, and Zn. In addition, adding Si can control or reduce the reaction of the crystal growth to make uniform particles of the fluorescent material.

In this specification, the yttrium-aluminum-oxide based fluorescent material 8 activated with cerium is meant in a broad sense. This broad sense includes a fluorescent material 8 capable of fluorescent action having at least one element selected from the group consisting of Lu, Sc, La, Gd, and Sm, which substitute with all or part of the yttrium and/or at least one element selected from the group consisting of Ba, Tl, Ga, and In, which substitute with all or part of the aluminum.

More specifically, it may be a photo-luminescent fluorescent material having a general formula $(Y_zGd_{1-z})_3Al_5O_{12}$:Ce (where $0<z\leq1$), or a photo-luminescent fluorescent material having a general formula $(Re_{1-a}Sm_a)_3Re'_5O_{12}$:Ce (where $0\leq a<1; 0\leq b\leq1$; Re is at least one element selected from the group consisting of Y, Gd, La, and Sc; and Re' is at least one element selected from the group consisting of Al, Ga, and In).

Since the fluorescent material 8 has a garnet structure, it is impervious to heat, light, and moisture. Its peak of excitation spectrum can be around 450 nm. The peak of its light-emission is around 580 nm, and the distribution of the light-emission spectrum is broad and the foot of the distribution extends to about 700 nm.

Gd (Gadolinium) may be added to the crystal lattice of the photo-luminescent fluorescent material to improve excited light-emission efficiency in the long-wavelength range over 460 nm. Increasing the Gd content shifts the peak wavelength of the light-emission toward a longer wavelength side, and also shifts the overall wavelength of the light-emission toward the longer wavelength side. In other words, if reddish light-emission color is needed, increasing the amount of substituted Gd can achieve it. On the other hand, the more Gd is increased, the lower the luminance of the photo-luminescent from the blue light. Other elements such as Tb, Cu, Ag, Au, Fe, Cr, Nd, Dy, Co, Ni, Ti, Eu may be added as well as Ce, if desired.

It Al in the composition of the yttrium-aluminum-garnet fluorescent material with the garnet structure is partially substituted with Ga, the wavelength of the light-emission shifts toward the longer wavelength region. In contrast, if Y in the composition is partially substituted with Gd, this shifts the wavelength of the light-emission toward the longer wavelength region.

If a part of Y is substituted with Gd, it is preferable that the percentage of substituted Gd is less than 10%, and the composition ratio or substitution is 0.03–1.0. In the case where the percentage of substituted Gd was less than 20%, the light in the green range would be higher and the light in the red range be lower. However, increasing the content of the Ce can compensate the light in the red range, so as to achieve the desired color tone without a reduction of the luminance. Such a composition can achieve preferable temperature characteristics, and improve reliability of the light-emitting diode. In addition, the photo-luminescent fluorescent material 8 can be adjusted to emit the light in the red range. For example, the light-emitting device can also emit an intermediate color such as pink.

A material for the photo-luminescent fluorescent material 8 can be obtained by mixing oxides or compounds sufficiently, which can easily become an oxide at high temperature, such as materials including Y, Gd, Al, and Ce according to their stoichiometric ratios. The mixed material also can be obtained by mixing coprecipitation oxides, which are formed by firing materials formed by a coprecipitating solution dissolving rare-earth elements, Y, Gd, and Ce, in acid according to a stoichiometric ratio with an oxalic acid and an aluminum oxide. After mixing, the mixed material and an appropriate amount of fluoride as flux, such as barium fluoride or ammonium fluoride, and inserting them into a crucible and then burning them at temperature 1350–1450 degrees Celsius in air for 2–5 hours. As a result, a burned material can be obtained. Next, the burned material is crushed in water by a hall mill. Then the photo-luminescent fluorescent material 8 can be obtained by washing, separating, drying, and finally sifting it through a sieve.

In the light-emitting device of the present invention, the photo-luminescent fluorescent material 8 may be a substance mixed with two or more kinds of yttrium-aluminum-garnet fluorescent material activated with cerium, or it can be a substance mixed with the yttrium-aluminum-garnet fluorescent material activated with cerium and other fluorescent materials 8.

Further, it is preferable that the particle size of the fluorescent material 8 used in the invention is in the range 10 μm–50 μm. It is more preferable that the size is 15 μm–30 μm. Fluorescent material 8 with a particle size less than 15 μm tends to aggregate and they cause sediment in the liquid resin because of their density and this might reduce transmittance of light. In the present invention, the fluorescent material 8 having smaller particle sizes are removed, and this can control or reduce shading of the light, and can improve or enhance the power of the light-emitting device. The fluorescent material 8 with a particle size in the above-mentioned preferable range of the present invention can have a high absorption coefficient and a high converting efficiency. It can also emit excited light with wavelengths across a broader range. Thus, including fluorescent material 8 having preferable optical characteristics with a relatively larger particle size, light having the main ambient wavelength from the light-emitting element 2 can be converted effectively, and thus this improves the efficiency of mass production of the light-emitting device.

In the present invention, the particle size is meant as a value obtained by a volume-based particle size distribution curve. The volume-based particle size distribution curve is measured by a laser diffraction and scattering method. Specifically, it can be obtained by measurement by laser diffraction type particle size distribution analyzer (SALD-2000A) with a sodium hexametaphosphate aqueous solution, in which each substance is dispersed with a 0.05% concentration and the measurement particle size range of 0.03 μm–700 μm, using 25 degrees Celsius and 70% humidity. It is preferable that the center particle size, which is the particle size value when the integrated value reaches 50% in the volume-base particle size distribution curve, used in the invention is in the range of 10 µm–50 µm. Further, it is preferable to include a high percent content of the fluorescent material 8 with this kind of value for the center particle size. Specifically, it is preferable that the value of this percentage content be between 20%–50%. Thus, by employing a fluorescent material 8 with less deviation, it can reduce the color unevenness. Therefore, this provides a light-emitting device with a preferable color tone.

The fluorescent material 8 may be provided in a binder at the back surface of the window portion of the rigid member 4 or directly in the rigid member 4 or the flexible member 3. It is not limited where the fluorescent material 8 is provided or located. It the fluorescent material 8 is provided in the binder added on the back surface of rigid member 4 or on the surface of the light-emitting element 2, an organic or inorganic material for the binder may be employed arid the material is not limited. In case an organic material is employed as the binder, a weather-resistant transparent resin such as an epoxy resin, acrylic resin, silicone, is preferably employed as the specific material. It is preferable to employ silicone for higher reliability and improvement in the dispersion of the fluorescent material 8.

Further, when the fluorescent material 8 is provided on the surface of the lens, it is preferable that an inorganic material with a thermal coefficient of expansion similar to that of the lens be employed as the binder. This can bring the fluorescent material 8 into intimate contact. A sedimentation process, sol-gel process, etc. can be employed as a specific method. For example, forming a slurry by mixing the fluorescent material 8, silanol ($Si(OEt)_3OH$), and ethanol, then discharging the slurry through a nozzle to the window portion of the rigid member 4. After that, $SiO_2$ can be formed by heating the silanol at a temperature of 300 degrees Celsius for 3 hours. Thus, the fluorescent material 8 can be applied to the lens.

An inorganic binding material also can be employed as the binder. The binding material is a so-called low-melting glass. It is preferable that the binding material is made of small particles, is less-absorbing of radiation rays in the range between the ultraviolet and the visible region, and has a high-stability in the binder. Alkaline earth borate, which has small particles obtained by a sedimentation process, is adequate.

Further, when the fluorescent material 8 with large particles is added, it is preferable that a binding material with ultrafine powder such as Degussa-manufactured silica, alumina, or pyrophosphoric acid, orthophosphate with a small particle size obtained by sedimentation process, etc. can be employed.

These binding materials can be employed individually or they can be mixed together.

An application method of the binding material will be described below. It is preferable to use the binding material in a wet-grinded slurry. The vehicle is a high-viscosity solution, which is composed of an organic solvent or deionized water with a small amount of a tack material. For example, an organic vehicle can be obtained by adding 1 wt % of nitrocellulose (the tack material) to butyl acetate (the organic solvent).

An application liquid is formed by adding the fluorescent material 8 to the binding slurry mentioned above. It is preferable that the content of the slurry in the application liquid is set so that the total amount of the binding material is about 1–3 wt % of the amount of the fluorescent material 8 Adding too much binding material is prone to reduce the luminous flux sustainability. Therefore, it is preferable to minimize the use of the binding material.

When the fluorescent material 8 is applied on the back surface or the front surface of the rigid member 4 by the binding material, it can be done by applying the application liquid on the back surface of the window, then drying it by blowing warm-air or hot-air thereon. Finally, it is baked at a temperature of 400–700 degrees Celsius so the vehicle can come off. Thus, the fluorescent material 8 is applied on the surface of the window by the binding material.

Diffusion Material

Further, in the present invention, a diffusion material can be added to the color-converting member with the fluorescent material 8. Barium titanate, titanium oxide, aluminum oxide, silicon oxide, etc. can be employed as the specific diffusion material. Thus, this material can provide the light-emitting device with a preferable directivity.

In this specification, the diffusion materials are particles with a center particle size greater than or equal to 1nm to less than 5 µm. It is preferable to employ a diffusion material with a center particle size greater than or equal to 1 nm to less than 5 µm, so that it can diffuse the light from the light-emitting element or the fluorescent material 8. Therefore this reduces color unevenness, which is prone to be occurred by using a fluorescent material 8 with a large particle size. It can also reduce the half-width of the light-emission spectrum, so that it can provide the light-emitting device with pure color. On the other hand, although the diffusion material with a center particle size greater than or equal to 1 nm to less than 5 µm has a low effectiveness for interference of the wavelength of light from the light-emitting element 2, it offers high-transmittance. Therefore, the diffusion material can increase viscosity of the resin without reducing luminous intensity. Thus, when the color-converting member is provided by potting, etc., it is possible to disperse the fluorescent material 8 uniformly in the resin in a syringe, and to maintain that state. Thus it is possible to produce with a high-yield even using a fluorescent material 8 with a large particle size, which is relatively difficult to handle. As mentioned above, the diffusion material in the present invention acts depending on its particle size range. The diffusion material can be employed selectively or by mixing.

Filler

Further, in the present invention, a filler can be added to the color-converting member with the fluorescent material 8. Although its specific material is similar to the diffusion material, its center particle size is different from the diffusion material. In this specification, the filler is a particle with a center particle size greater than or equal to 5 µm to less than or equal to 100 µm. Adding the filler with such a particle size to the transparent resin can improve chromaticity unevenness of the light-emitting device by light-scattering action. It can also improve impact-resistance of the transparent resin. Thus, it can prevent disconnection of the wires electrically connecting the light-emitting element 2 with the external terminals, or peeling of the bottom surface of the light-emitting element 2 from the bottom surface of the recess portion of the package 1. Therefore, it can provide the light-emitting device with a high reliability. Furthermore, the filler can adjust the flowability of the resin for a long time. Thus, the filler makes it possible to form the mold member at a desired position and this improves mass production with a high yield.

Furthermore, it is preferable that the filler has particle size and/or form similar to the fluorescent material 8. In this specification, a similar particle size is defined such that the difference between the center particle sizes of particles is less than 20%. A similar form is defined such that the degree of circle ((the degree of circle)=(circumference of the perfect circle, whose area is equal to the area of surface of a projection of the particle)/(circumference of the surface of a projection of the particle)) is less than 20%. This disperses the fluorescent material 8 in the resin preferably causing action between the fluorescent substance and the filler so that color unevenness can be reduced. In addition, it is preferable that both the fluorescent substance and the filler have a center particle size of 15 µm–50 µm. It is more preferable that this size is 20 µm–50 µm. Thus, adjusting the particle size provides particles with a preferable distance from each other. Therefore, this arrangement provides an outgoing path of light so that it can reduce any decrease in the luminous intensity caused by adding the filler, and it can also improve directivity.

The light-emitting device of the invention is illustrated in more detail by reference to the following examples. The examples described below are for illustration, and the light-emitting device of the invention is not limited to the specific descriptions below.

EXAMPLE 1

A surface mount type light-emitting device as shown in FIG. 1 is formed. A nitride semiconductor having a semiconductor of $In_{0.2}Ga_{0.8}N$ with a monochromatic light-emission peak 475 nm as a light-emitting layer is employed as an LED chip. More specifically, the LED chip can be formed by flowing TMG (trimethylgallium) gas, TMT (trimethylindium) gas, nitrogen gas, and a dopant gas with a carrier gas onto a cleaned sapphire substrate so as to laminate nitride semiconductor layers by a MOCVD method. An n-type nitride semiconductor layer and a p-type nitride semiconductor layer can be formed by changing $SiH_4$ and $Cp_2Mg$ as the dopant.

The element structure of the LED chip has an n-type GaN layer, which is an undoped nitride semiconductor, on the sapphire substrate; a GaN layer, which is a Si-doped n-type contact layer providing an n-type terminal thereon; and the light-emitting layer having a multi-quantum-well structure with 5 sets of an InGaN layer successively interposed with a GaN layer. Here, each set is composed of the GaN layer as a barrier layer, the InGaN layer as a well layer, and the GaN layer as the barrier layer. Further, a Mg-doped AlGaN layer as a p-type cladding layer on the light-emitting layer, and a Mg-doped GaN layer as a p-type contact layer are successively laminated. (In addition, a GaN layer is formed on the sapphire substrate at a low temperature as a buffer layer. Furthermore, after forming the layers, the p-type semiconductor layer is annealed at a temperature greater than or equal to 400 degrees Celsius.)

Each surface of the p-n contact layers is exposed by etching in the same surface side of the nitride semiconductor on the sapphire substrate. Each of the positive and negative base terminals are formed on each contact layer by sputtering. In addition, after a thin metal layer is formed on the p-type nitride semiconductor as a transparent terminal, the base terminal is formed on a part of the transparent terminal. After scribing lines are drawn on the formed semiconductor wafer, the wafer is broken by external forces into the LED chips to be used as the light-emitting element 2.

On the other hand, a plurality of pairs of the lead terminals 5 aligned in one direction are formed by stamping a first copper plate having a 0.3 mm thickness. Next, a metal base material with a recess portion in the front surface is formed by stamping and pressing a second copper plate with a 1.2 mm thickness. The second copper plate is thicker than the first copper plate. The pair of the lead terminals 5 and the metal base member 6 are inserted from directions that face each other.

Each lead terminal 5 is provided to be symmetrical with respect to the metal base member 6 and to be disposed above the metal base member 6 in a metal mold. At that time, the top end of each lead terminal 5 is supported on its bottom by a supporter. Thus, the first copper plate and the second copper plate provided in the mold can be formed into one body with mold resin so as to form a package 1. The formed package has a first front surface extending outwardly at least above the recessed portion; a second front surface extending outwardly above the first front surface; and a third surface extending outwardly above the second front surface. The outline of the second front surface is a quadrangle shape with rounded corners. The corners of the first front surface have projecting portions toward the corners of the second front surface. When the rigid member 4 is disposed, the projecting portions are exposed outside of the rigid member 4.

Next, the LED chip is die-bonded in the recess of the metal base member 6 with an Ag—Sn alloy. The bonding member to be used can include not only the alloy but also a resin or glass including a conductive material. It is preferable that the included conductive material is Ag. Employing a paste with an 80%–90% content of Ag can provide the light-emitting device with a high-thermal dispersion and it is less stressed after binding. Further, it is preferable that the light-emitting element 2 having a metal layer on the substrate side is fixed so that it can improve thermal dissipation and outgoing efficiency of light.

Next, each terminal of the die-bonded LED chip and each lead terminal 5 exposed from the bottom surface of the recess portion of the package 1 are connected by Ag wires for conducting electricity. When resin is not used as the component member, Al wires can be employed.

Figure 4:
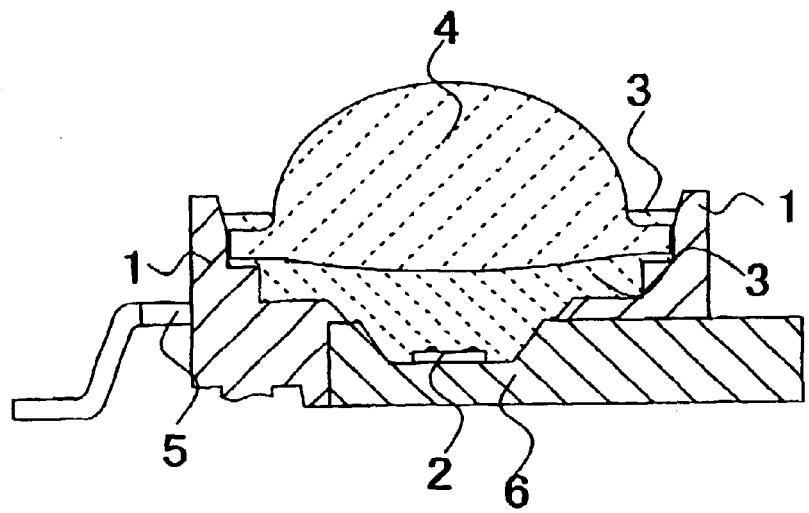
FIG. 4 shows a cross-sectional view taken along line IV—IV in FIG. 1.
Figure 5:
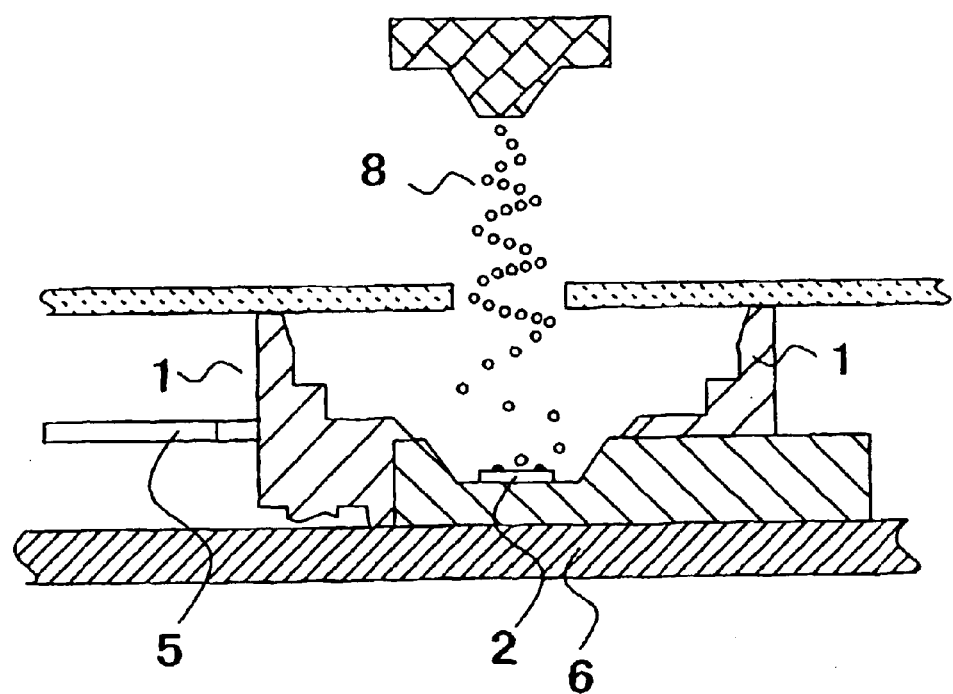
FIG. 5 shows a cross-sectional view of a first process for forming a light-emitting device according to example 10.
Figure 6:
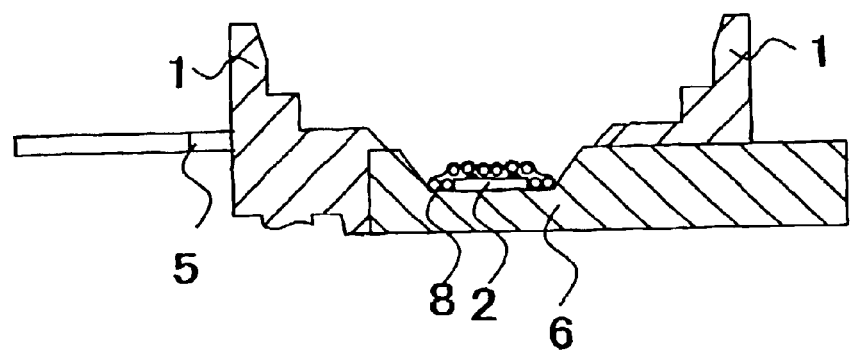
FIG. 6 shows a cross-sectional view of a step in the first process for forming a light-emitting device according to example 10.
Figure 7:
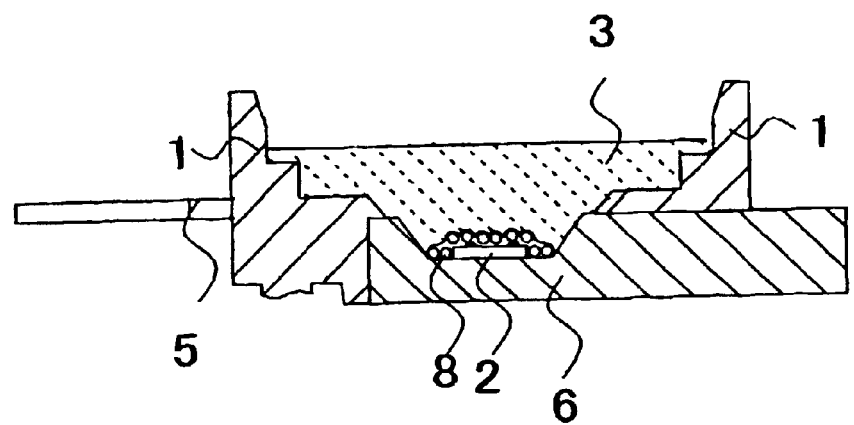
FIG. 7 shows a cross-sectional view of another step in the first process for forming a light-emitting device according to example 10.
Figure 8:
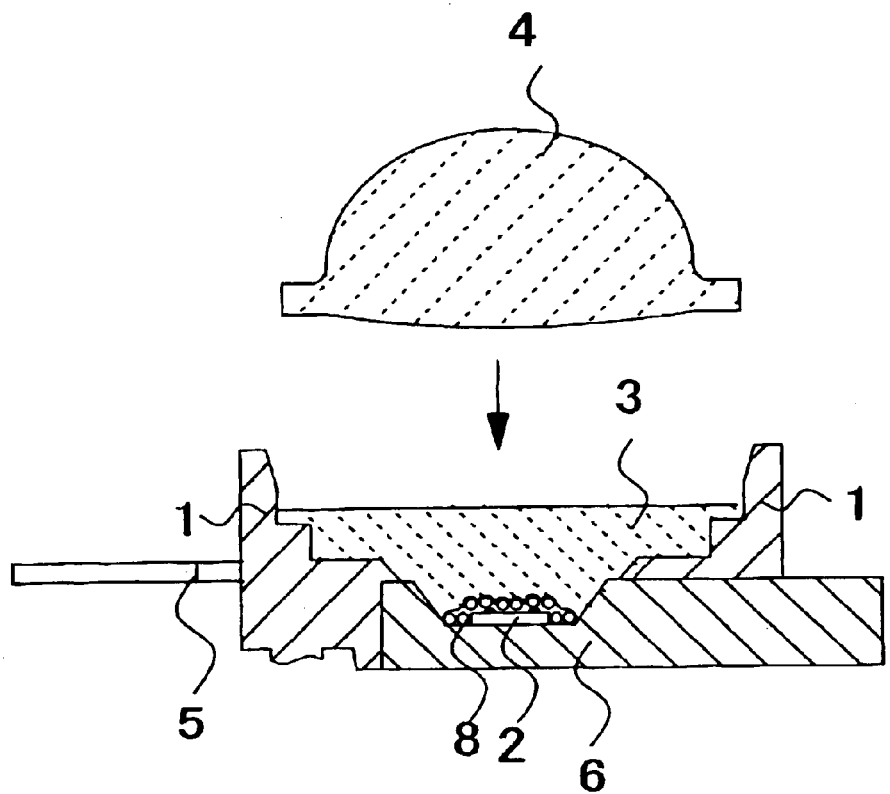
FIG. 8 shows a cross-sectional view of another step in the first process for forming a light-emitting device according to example 10.
Figure 9:
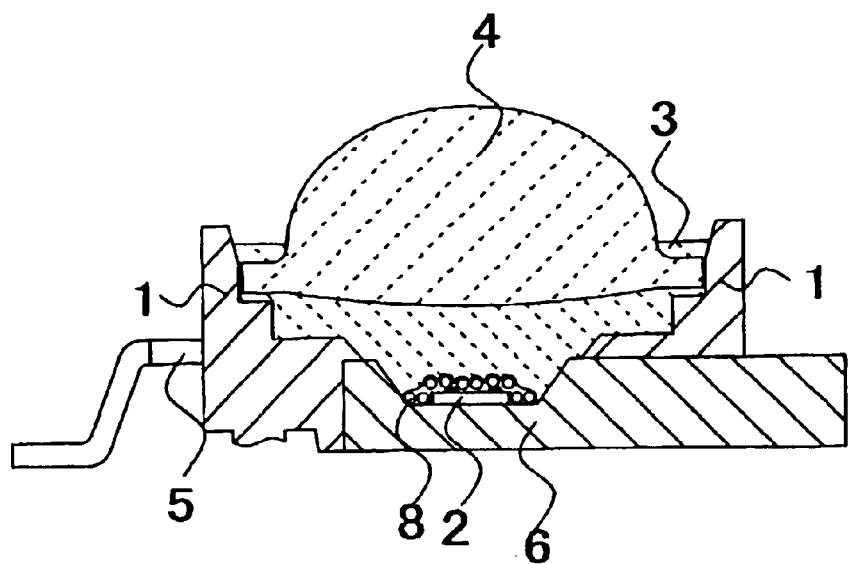
FIG. 9 shows a diagram of a cross-sectional view of the assembled light-emitting device according to one embodiment of the present invention.

Next, gel silicone resin is injected to cover from the recess portion to the second front surface by potting. The resin can be injected into the package from a bottom surface area such as is shown in the lower left corner of FIG. 4. Subsequently, a lens made of a glass as the transparent rigid member 4 is disposed on the gel silicone resin by pressing downwardly. A thermoplastic resin such as a plastic, etc. also can be employed as the lens. Further, the lens has a continuous back surface. The back surface is formed in a convex shape projecting downwardly. Furthermore, it has a flange portion, whose back surface is parallel to the second front surface. In addition, the outline of the flange portion is formed in a circle shape disposed in the outline of the second front surface. The lens formed as mentioned above is disposed on the second front surface, then a part of the gel silicone resin overflows over the front surface of the flange portion through the projecting portion of the first front surface exposed outside of the lens. After that, each component member is structurally formed into one body by heating at a temperature of 70 degrees Celsius for 2 hours, at a temperature of 100 degrees Celsius for 2 hours, and at a temperature of 150 degrees Celsius for 2 hours.

The light-emitting device produced as mentioned above can prevent including trapped matter such as air bubbles, so that it has a high reliability and preferable optical characteristics.

EXAMPLE 2

Figure 10:
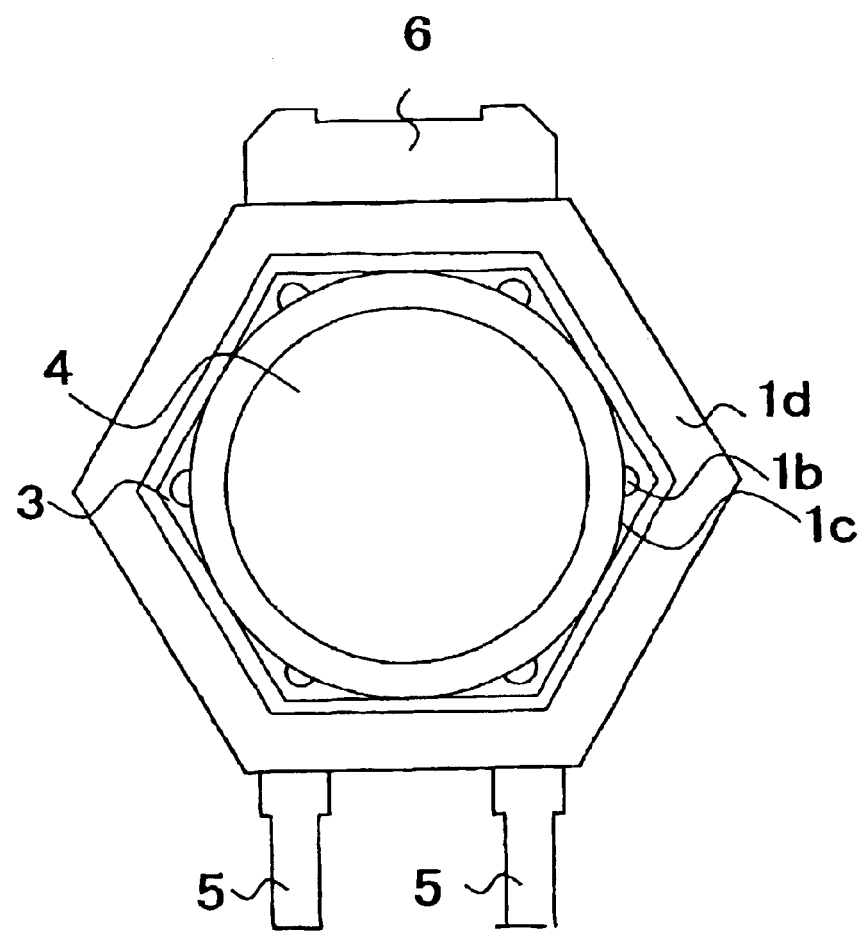
FIG. 10 shows a plan view of another light-emitting device according to the present invention.

As shown in FIG. 10, a light-emitting device is formed in the same manner as Example 1 except for forming a cornered outline of the second front surface in a hexagon shape. This provides a light-emitting device with more effective mass production and better mountability with a higher density compared to the device in Example 1.

EXAMPLE 3

Figure 11:
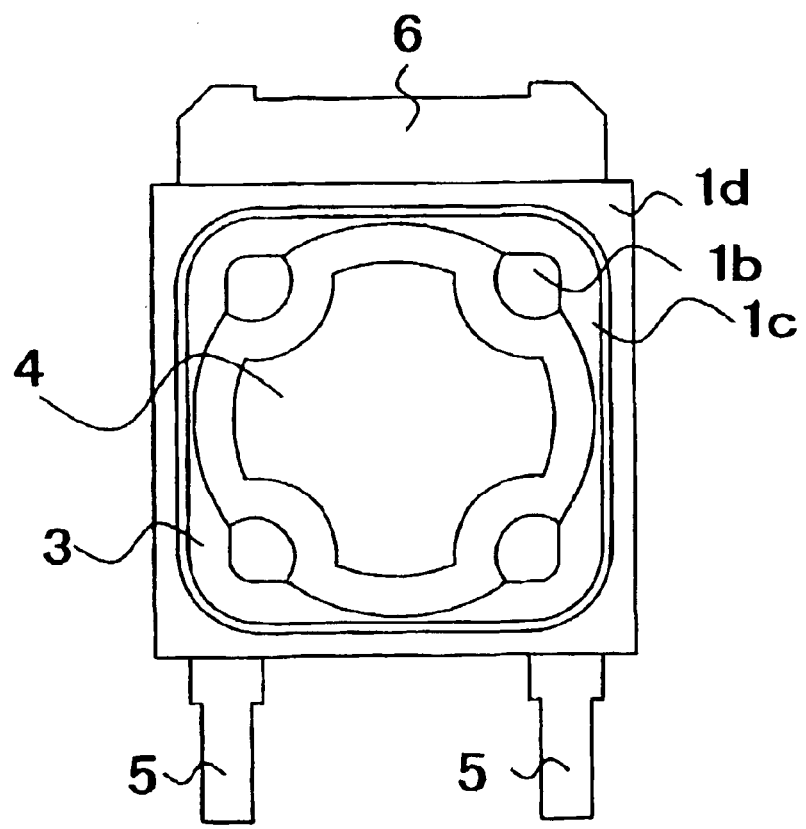
FIG. 11 shows a plan view of another light-emitting device according to the present invention.

As shown in FIG. 11, a light-emitting device can be formed in the same manner as Example 1 except for 1) forming the outline of the second front surface and the outline of the first front surface in a polygonal shape with similar relations between them, and 2) forming the lens with a notch portion in its outline to expose corners of the first front surface. This structure provides a light-emitting device with effects similar to Example 1.

EXAMPLE 4

A light-emitting device is formed in the same manner as Example 3 except for forming the lens for the rigid member 4 in a convex lens shape. This shape improves the frontward luminous intensity 50% more than Example 1.

EXAMPLE 5

A light-emitting device is formed in the same manner as Example 1 except that a fluorescent material 8 is previously included inside of the lens.

As for the fluorescent material 8, a solution dissolving rare-earth elements Y, Gd, and Ce, in acid according to a stoichiometric ratio that is coprecipitated with oxalic acid. Then, by mixing the coprecipitation oxides, which are formed by burning the coprecipitated materials, and an aluminum oxide, a mixed material can be obtained. A burned material can be obtained after mixing the mixed material and barium fluoride as flux, inserting them in to a crucible, and then burning them at a temperature of 1400 degrees Celsius in air for 3 hours. Next, the burned material is crushed in water by a ball mill. Then it is washed, separated, dried, and finally sifted through a sieve. The fluorescent material 8, $(Y_{0.995}Gd_{0.005})_{2.750}Al_5O_{12}:Ce_{0.250}$ with a center particle size of 22 µm can be formed.

Mixing the obtained fluorescent material 8 and a powder of silica in a ratio of 1:2, and then molding it at once by melt-curing in a mold, a color-converting light-emitting device can be obtained. This device has effects similar to Example 1, including high reliability and it can emit a high power white light.

EXAMPLE 6

A light-emitting device was formed in the same manner as Example 5 except for forming a color-converting member on the back surface of the rigid member 4. The color-converting member is made by applying 50% wt of the fluorescent material 8 mentioned above in a slurry that contains 90% wt of nitrocellulose and 10% wt of γ-alumina. This is then heat-cured at a temperature of 220 degrees Celsius for 30 minutes. The light-emitting device can have a similar effect to Example 5.

EXAMPLE 7

A light-emitting device was formed in the same manner as Example 1 except for disposing the lens after applying an elastic silicone resin onto the gel silicone resin provided on the light-emitting element 2. This arrangement improves contact with the lens and can provide a light-emitting device with a high reliability.

EXAMPLE 8

A light-emitting device was formed in the same manner as Example 7 except for including 50% wt of fluorescent material 8 in the gel silicone. The above-mentioned gel silicone has a laminated structure that consists of two or more layers. The above-mentioned fluorescent material is included in at least one or more of these layers. The light-emitting device produced can have similar effects as Example 5.

EXAMPLE 9

A light-emitting device was formed in the same manner as Example 1 except for previously molding the light-emitting element 2 by using a silica gel containing 50% wt of the fluorescent material 8. This light-emitting device can also have effects similar to Example 5.

EXAMPLE 10

A light-emitting device is formed in the same manner as Example 1 except for coating the surface of the light-emitting element 2 with a continuous color-converting member containing a fluorescent material 8 and $SiO_2$. A method for forming the color-converting layer will be described below.

(Step 1)

Although methyl silicate, ethyl silicate, N-propyl silicate, N-butyl silicate can be employed, alkyl silicate, an achromatic and transparent oligomer liquid, which is condensed from ethyl silicate containing 40% wt of $SiO_2$, is employed in this example. Further, at the time, the ethyl silicate is used with sol which is previously hydrolyzed under the catalyst by water.

First, a solution mixed with sol ethyl silicate, ethylene glycol, and the fluorescent material 8 in a ratio of 1:1:1, is agitated to adjust the applying liquid. Because the sol ethyl silicate is prone to dry, it is preferable to mix it with an organic solvent with a high boiling point (100–200 degrees Celsius) such as butanol or ethylene glycol to prevent gelation. Mixing the organic solvent having a high boiling point can prevent clogging the nose of a nozzle caused by gelation of the sol ethyl silicate. Thus, this process improves manufacturing efficiency.

(Step 2)

The applying liquid is put into a container, and then the applying liquid is conveyed from the container to the nozzle by a circulating pump. The flow rate of the applying liquid is adjusted by a valve. The applying liquid is sprayed from the nozzle in a mist. The mist of the applying liquid is sprayed in spiral fashion by rotation. Specifically, the mist spreads in a conical shape at the nozzle side, and it spreads in a cylindrical shape at a distance. Thus, the continuous color-converting layer with a fluorescent material dispersed evenly can coat all of the front surface, the side surfaces, and the corners of the light-emitting element 2 with substantially uniform thickness. Therefore, this arrangement improves color unevenness such as a blue ring. Further, it is preferable that the color-converting layer is made of one particle layer so that it can improve the outgoing efficiency of light. In this example, the distance between the front surface of the light-emitting element 2 and the bottom end of the nozzle is set at 40–50 mm to provide the surface of the light-emitting element 2 in a position where the mist spreads in a cylindrical shape, so as to form the continuous color-converting layer with a substantially uniform thickness on the whole planar surface of the recessed portion.

In addition, the step mentioned above is performed with heating the applied portion. Thus, the heat can vaporize the ethanol or the solvent produced by solation of the ethyl silicate at the moment of spraying them on the light-emitting element 2. Therefore, the color-converting layer can be formed without deleterious effects on the light-emitting element 2. In this example, a spray coating is performed while disposing the package 1 on the heater. It is preferable that the temperature of the heater is adjusted to be greater than or equal to 50 degrees Celsius and less than or equal to 300 degrees Celsius.

(Step 3)

After step 2, the product is set aside at room temperature and then the fluorescent material 8 is applied with $SiO_2$ by reaction between the sol ethyl silicate and the moisture in the air.

(Step 4)

Next, the product is dried at 300 degrees Celsius for 2 hours. It is preferable that alkyl silicate, which can be applied on the surface of the light-emitting element 2 at a temperature of 300 degrees Celsius be employed as the applying material. This is because the nitride light-emitting element 2 has its performance damaged if the temperature is more than 350 degrees Celsius.

The light-emitting device mentioned above is composed entirely of inorganic materials so that it can be high-heat-radiative and it can also be impervious to light in the near-ultraviolet or ultraviolet range. It should be appreciated that the light-emitting device employs elements such as the light-emitting element 2 that emits light in the ultraviolet range.

EXAMPLE 11

A light-emitting device is formed in the same manner as Example 8 except for employing a fluorescent material mix that disperses a first fluorescent material, $(Y_{0.995}Gd_{0.005})_{2.750}Al_5O_{12}:Ce_{0.250}$, and a second fluorescent material, $Ca_{1.8}Eu_{0.2}Si_5N_8$. The light-emitting device of Example 11 can have more preferable color rendering characteristics than Example 8. Although the second fluorescent material is not especially limited, it is preferable for fine color rendering to employ MxSiyNz:Eu (M is at least one rare-earth element from the group of Ca, Sr, Ba, and Zn. where, z=2/3x+y), which can have similar excitation wavelength to the first fluorescent material and a fluoresce in the range from yellow to red.

Specifically, it is preferable that the fluorescent material is a nitride fluorescent material, which is L-M-N;R, or L-M-O—N:R (L includes at least one element selected from the group consisting of Be, Mg, Ca, Sr, Ba, and Zn; M includes at least one element selected from the group consisting of C, Si, Ge, Sn, Ti, Zr, and Hf; N is nitrogen; and R is a rare-earth element). Further, it is more preferable that the fluorescent material is a crystal structure of a nitride fluorescent material, which is $L_xM_yN_{\{(2/3)x+(4/3)y\}}:R$, or $L_xM_yO_zN_{\{(2/3)x+(4/3)y-(2/3)z\}}:R$ (L includes at least one element selected from the group consisting of Be, Mg, Ca, Sr, Ba, and Zn; M includes at least one element selected from the group consisting of C, Si, Ge, Sn, Ti, Zr, and Hf; N is nitrogen; and R is a rare-earth element). By employing these fluorescent materials, the light-emitting device is capable of emitting a warm white color.

More specifically, the fluorescent material 8 can employ $Ca_2Si_5O_{0.1}N_{7.9}:Eu$, $Sr_2Si_5O_{0.1}N_{7.9}:Eu$, $(Ca_aSr_{1-a})_2Si_5O_{0.1}N_{7.9}:Eu$ $CaSi_7O_{0.5}N_{9.5}:Eu$, to which Mu, B are added, or $Ca_2Si_5O_{0.5}N_{7.9}:Eu$, $Sr_2Si_5O_{0.5}N_{7.7}:Eu$, $(Ca_aSr_{1-a})_2Si_5O_{0.1}N_{7.9}:Eu$, to which a rare-earth element is added, as examples of fundamental constituent elements.

Additionally, although it is possible to use $Sr_2Si_5N_8:Eu$, Pr; $Ba_2Si_5N_8:Eu$, Pr; $Mg_2Si_5N_8:Eu$, Pr; $Zn_2Si_5N_8:Eu$, Pr; $SrSi_7N_{10}$: Eu, Pr; $BaSi_7N_{10}:Eu$, Ce; $MgSi_7N_{10}:Eu$, Ce; $ZnSi_7N_{10}:Eu$, Ce; $Sr_2Ge_5N_8:Eu$, Ce; $Ba_2Ge_5N_8:Eu$, Pr; $Mg_2Ge_5N_8:Eu$, Pr; $Zn_2Ge_5N_8:Eu$, Pr; $SrGe_7N_{10}:Eu$, Ce; $BaGe_7N_{10}:Eu$, Pr; $MgCe_7N_{10}:Eu$, Pr; $ZnGe_7N_{10}:Eu$, Ce; $Sr_{1.8}Ca_{0.2}Si_5N_8:Eu$, Pr; $Ba_{1.8}Ca_{0.2}Si_5N_8:Eu$, Ce; $Mg_{1.8}Ca_{0.2}Si_5N_8:Eu$, Pr; $Zn_{1.8}Ca_{0.2}Si_5N_8:Eu$, Ce; $Sr_{0.8}Ca_{0.2}Si_7N_{10}:Eu$, La; $Ba_{0.8}Ca_{0.2}Si_7N_{10}:Eu$, La; $Mg_{0.8}Ca_{0.2}Si_7N_{10}:Eu$, Nd; $Zn_{0.8}Ca_{0.2}Si_7N_{10}:Eu$, Nd; $Sr_{0.8}Ca_{0.2}Ge_7N_{10}:Eu$, Tb; $Ba_{0.8}Ca_{0.2}Ge_7N_{10}:Eu$, Tb; $Mg_{0.8}Ca_{0.2}Ge_7N_{10}:Eu$, Pr; $Zn_{0.8}Ca_{0.2}Ge_7N_{10}:Eu$, Pr; $Sr_{0.8}Ca_{0.2}Si_6GeN_{10}:Eu$, Pr; $Ba_{0.8}Ca_{0.2}Si_6GeN_{10}:Eu$, Pr; $Mg_{0.8}Ca_{0.2}Si_6GeN_{10}:Eu$, Y; $Zn_{0.8}Ca_{0.2}Si_6GeN_{10}:Eu$, Y; $Sr_2Si_5N_8:Pr$; $Ba_2Si_5N_8:Pr$; and $Sr_2Si_5N_8:Tb$; $BaGe_7N_{10}:Ce$, the fluorescent material 8 is not limited these materials. Similarly, when desired, it is adequate that the fluorescent material 8 represented in these general formulas include preferable elements as a third component, a fourth component, a fifth component, etc.

EXAMPLE 12

A light-emitting device is formed in the same manner as Example 11 except for binding the fluorescent material 8 with an applying liquid by employing fluorocarbon polymers (PTFE: polytetrafluoroethylene) instead of ethyl silicate. The light-emitting device can have a similar performance to Example 11 and a high yield.

EXAMPLE 13

A light-emitting device is formed in the same manner as Example 11 except for employing an LED chip with a main wavelength and $(Sr_{0.96}, Eu_{0.01}, Mn_{0.03})_{10}(PO_4)_6Cl_2$ as the fluorescent material 8.

A method forming the above fluorescent material will be described below. First, adjusting $SrHPO_4$, $SrCO_3$, $Eu_2O_3$, $MnCO_3$, and $NH_4Cl$ as materials to achieve the above composition ratio, then mixing them as follows: $SrHPO_4$: 1000 g, $SrCO_3$: 482.4 g, $Eu_2O_3$: 16.0 g, $MnCO_3$: 35.2 g, $NH_4Cl$: 116.5 g.

Next, after measuring the above materials, they are dry-mixed sufficiently by a mixer such as a ball mill. Then, they are inserted in a crucible made of SiC, quartz, alumina, etc., and the temperature is raised to 1200 degrees Celsius at the rate of 960 degrees Celsius per hour in $N_2$, $H_2$ as a reduction atmosphere, and burning them at a constant temperature of 1200 degrees Celsius for 3 hours. Finally, the obtained material is pulverized in water, and then dispersed, sifted, separated, and dried. Thus, a powder of the objective fluorescent material 8 can be obtained.

By applying the color-converting layer with the obtained fluorescent material mentioned above on periphery of the light-emitting element 2 and the plane of the recessed portion, similar to Example 10, can provide a light-emitting device capable of emitting a high luminance.

EXAMPLE 14

The materials $CaHPO_4$, $CaCO_3$, $EU_2O_3$, $MnCO_3$, $NH_4Cl$, and $NH_4Br$ Are combined in a composition ratio of $(Ca_{0.93}, Eu_{0.05}, Mn_{0.02})_{10}(PO_4)_6Br_{1.0}Cl_{1.0}$, and then they are mixed.

After measuring the above materials, they are mixed sufficiently by dry-mixing in a mixer such as a ball mill. Then, the mixed materials are inserted in a crucible made of SiC, quartz, alumina, etc., and the temperature is raised to 1200 degrees Celsius at a ratio of 960 degrees Celsius per hour in $N_2$, $H_2$ as a reduction atmosphere, and burning them at a constant temperature of 1200 degrees Celsius for 3 hours. Finally, the obtained material is pulverized in water, and then dispersed, sifted, separated, and dried. Thus, a powder of the objective fluorescent material can be obtained. By applying the color-converting layer with the obtained fluorescent material mentioned above on the periphery of the light-emitting element 2 and the plane of the recessed portion similar to Example 13, except employing this fluorescent material can provide a light-emitting device capable of emitting a high luminance.

EXAMPLE 15

A light-emitting device is formed in the same manner as Example 13 except for employing the fluorescent material, which is mix-dispersed the first fluorescent material $(Y_{0.995}Gd_{0.005})_{2.750}Al_5O_{12}:Ce_{0.250}$ and the second fluorescent material $(Ca_{0.93}, Eu_{0.05}, Mn_{0.02})_{10}(PO_4)_6Br_{1.0}Cl_{1.0}$. This example provides a light-emitting device capable of emitting a high luminance.

EXAMPLE 16

A light-emitting device is formed in the same manner as Example 14 except for the following points. After forming a first color-converting layer by applying an applying liquid of $Al_2O_3$ with the fluorescent material, $(Ca_{0.93}, Eu_{0.05}, Mn_{0.02})_{10}(PO_4)_6Br_{1.0}Cl_{1.0}$, on the periphery of the light-emitting element 2 and the plane of the recessed portion by the above spray technique, a second color-converting layer is formed by applying $SiO_2$ with the fluorescent material, $(Y_{0.995}Gd_{0.005})_{2.750}Al_5O_{12}:Ce_{0.250}$, by using the sol ethyl silicate similar to Example 11. Thus, the layers are formed as mentioned above, so that it can achieve the following relationship: the refractive index of the second color-converting layer is less than the refractive index of the first color-converting layer which is less than the refractive index of the gallium nitride compound semiconductor layer. This improves the outgoing efficiency of light from the light-emitting element 2, so as to provide a light-emitting device capable of emitting high power light.

EXAMPLE 17

A light-emitting device is formed in the same manner as Example 1 except for employing a flexible member 3 which is a gel silicone resin with a first fluorescent material (20 wt % of $Y_{2.985}Al_3Ga_4O_{12}:Ce_{0.035}$,) and the second fluorescent material (5 wt % of $Ca_{1.8}Eu_{0.2}Si_5N_8$) against the gel silicone resin having 100 wt %, respectively. This light-emitting device can emit in a warm white color with a color temperature of 2700 K.

EXAMPLE 18

Figure 12:
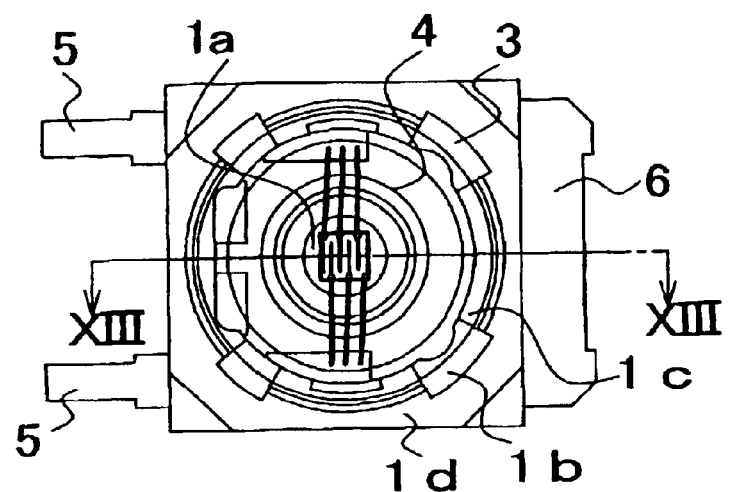
FIG. 12 shows a plan view of another light-emitting device according to the present invention.
Figure 13:
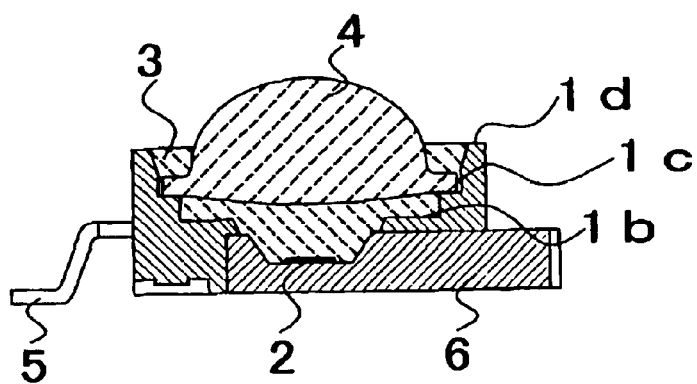
FIG. 13 shows a cross-sectional view taken along line XIII—XIII in FIG. 12.

A light-emitting device is formed in the same manner as Example 1 except for using the package as shown in FIGS. 12 and 13. The package has a corner projection portion of the first front surface 1b that extends outwardly of the second surface 1c toward the corner of the package. The corner projection portion includes a substantially trapezoidal shape that is wider toward the corner of the package. As a result, when the lens is pressed, the shape of the corner projection portion of the first front surface can help control the overflow of the silicon gel resin. Moreover, the effect of the overflow can be uniform over the entire package by having a corner projection portion in each corner of the package. The structure of the package and the number of the above-mentioned projection parts is not specifically limited to the arrangement shown in these figures.

EXAMPLE 19

Figure 17:
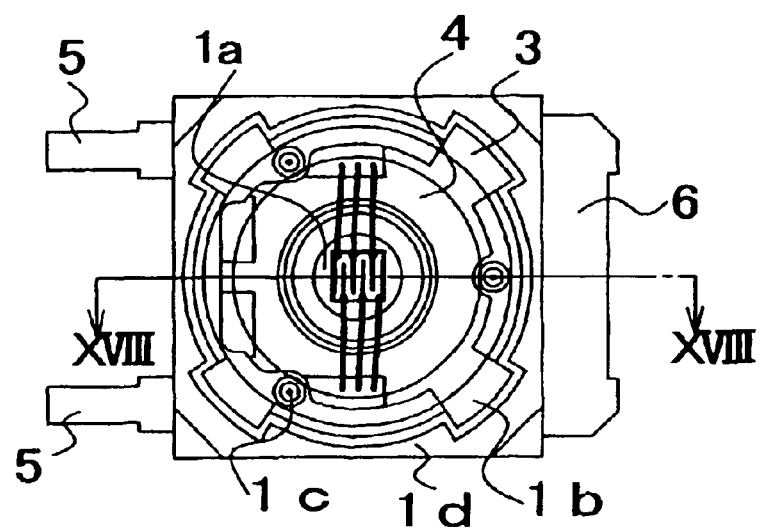
FIG. 17 shows a plan view of another light-emitting device according to the present invention.
Figure 18:
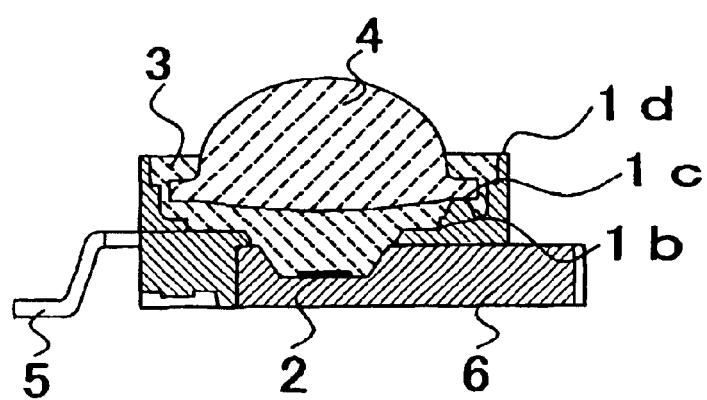
FIG. 18 shows a cross-sectional view taken along line XVIII—XVIII in FIG. 17.

A light-emitting device is formed in the same manner as Example 1 except for using the package as shown in FIGS. 17 and 18. The package has a plurality of truncated cone stands that support a back surface of the rigid member 4. Because of the surface contact between the silicon gel and the lens using these cone stands, it is possible to reduce the separation between these two elements caused by a difference in their heat expansion rates. It is preferable to for three or more cone stands at equal intervals. Using this arrangement, it is possible to further reduce the separation between these elements.

EXAMPLE 20

Figure 14:
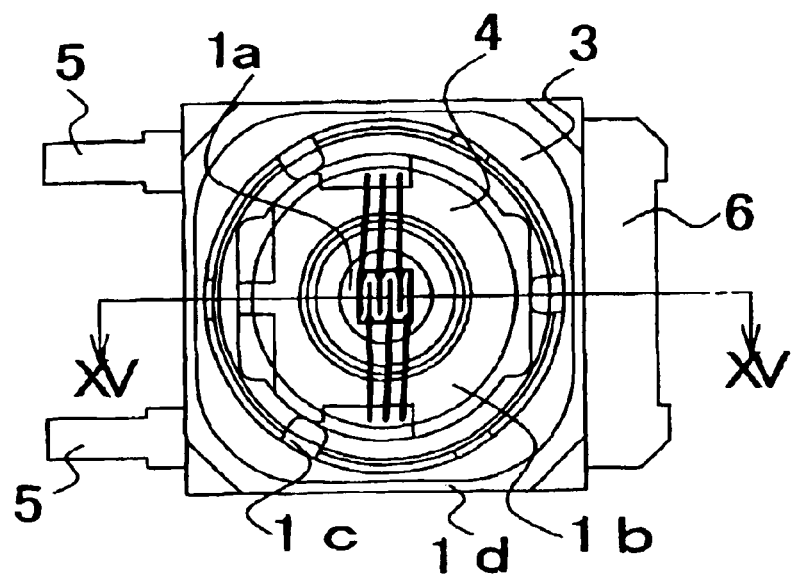
FIG. 14 shows a plan view of another light-emitting device according to the present invention.
Figure 15:
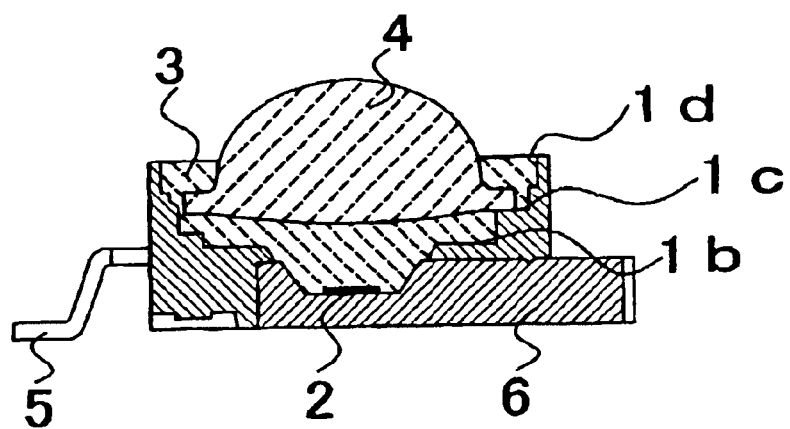
FIG. 15 shows a cross-sectional view taken along line XV-XV in FIG. 14.

A light-emitting device is formed in the same manner as Example 1 except for using the package as shown in FIGS. 14 and 15. The package has a plurality of hog-backed pillar stands having a shape similar to half of a cylinder that support the back surface of the lens. As a result, the light-emitting device of this Example can prevent separation between the silicon gel and the lens. Also, this structure has a higher reliability than the luminescence device of Example 19.

EXAMPLE 21

Figure 19:
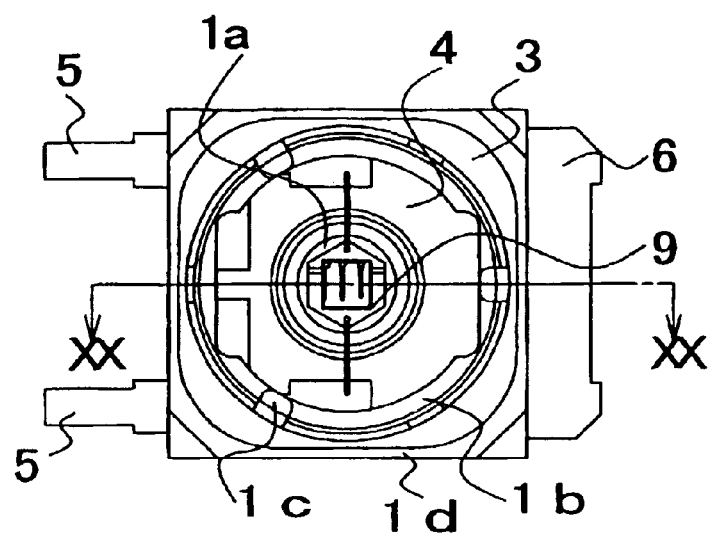
FIG. 19 shows a plan view of another light-emitting device according to the present invention.
Figure 20:
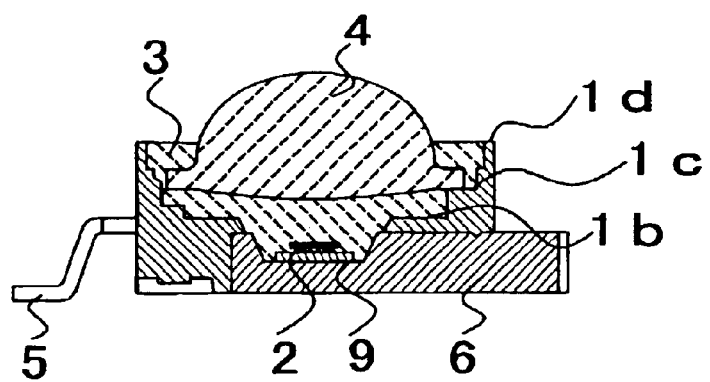
FIG. 20 shows a cross-sectional view taken along the line XX—XX in FIG. 19.

A light-emitting device is formed in the same manner as Example 1 except for mounting the light-emitting element 2 on a sub-mount 9 as shown in FIGS. 19 and 20. The sub-mount 9 is fixed with Ag paste in the recessed portion provided on the metal base member 6, with metal bumps. This arrangement improves its optical characteristics and reliability. It should also be possible to may achieve the same result by using a protector element of a silicon semiconductor, a metal member of aluminum nitride, or the like, as the sub-mount 9. When the sub-mount 9 is conductive, a conductive pattern laminated thereon via an insulating layer such as $SiO_2$, SiN may be employed. In addition, Au bumps, Sn—Pb solder bumps, Zn—Ag solder bumps, or the like can be employed. However, the metal bumps are not limited to a particular material as long as they are capable of conduction.

EXAMPLE 22

Figure 21:
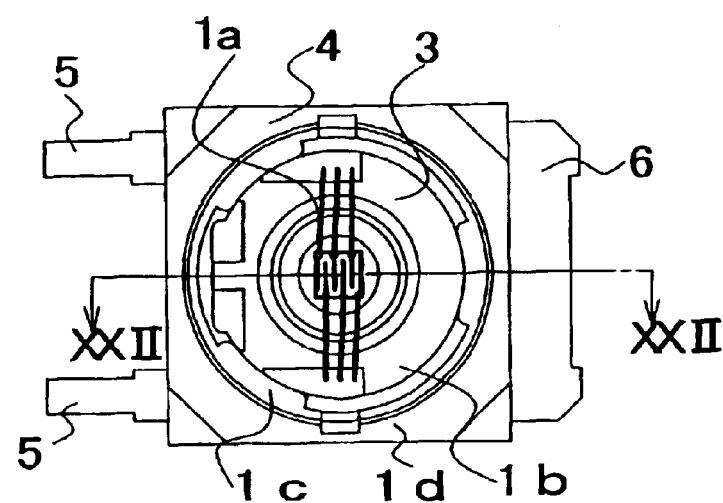
FIG. 21 shows a plan view of another light-emitting device according to the present invention.
Figure 22:
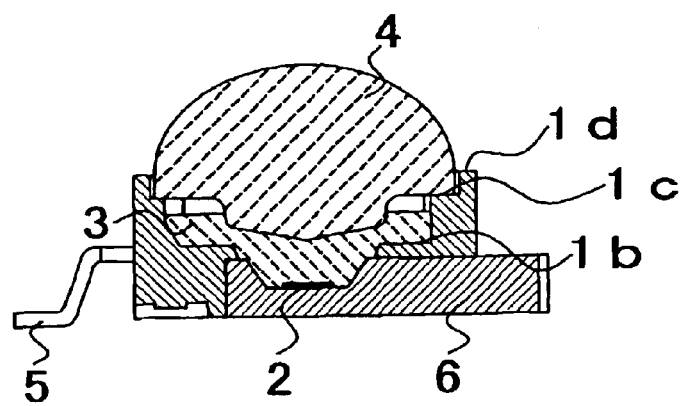
FIG. 22 shows a cross-sectional view taken along line XXII—XXII in FIG. 21.
Figure 23:
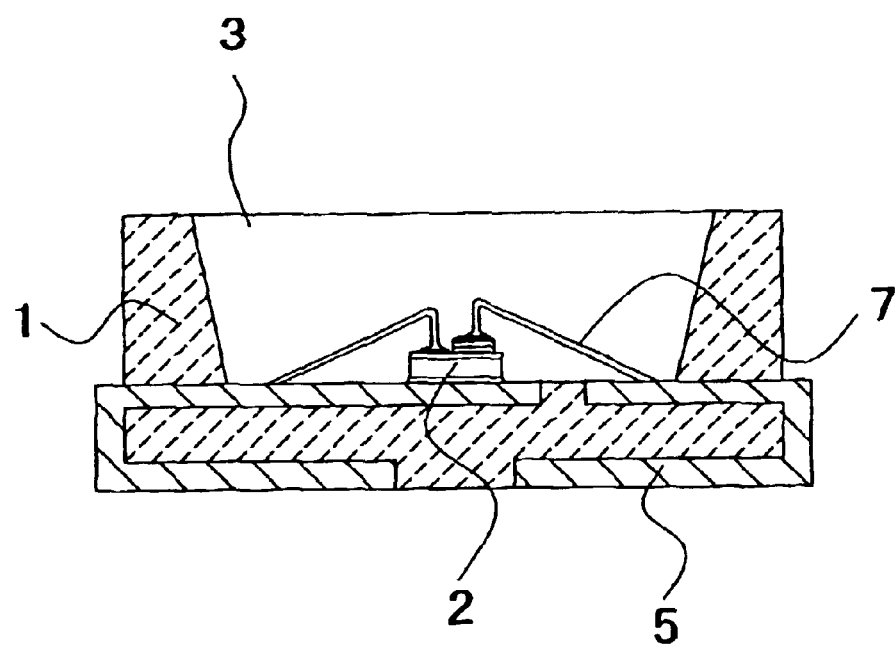
FIG. 23 shows a cross-sectional view of a light-emitting device for comparison with the present invention.

A light-emitting device is formed in the same manner as Example 1 except for using a specifically shaped rigid member 4 as shown in FIGS. 21 and 22. The rigid member 4 includes a portion of the back surface that is disposed above the flexible member 3. The back surface also includes a substantially convex or slightly V-shaped portion that is pressed into the flexible member 3.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within meets and bounds of the claims, or equivalence of such meets and bounds thereof are therefore intended to be embraced by the claims.

This application is based on Japanese priority application no. 2002-41192 filed on Feb. 19, 2002, the content of which is incorporated herein by reference.

What is claimed is:

1. A light-emitting device comprising:
   a light-emitting element;
   a transparent resin covering the light-emitting element chip; and a transparent member having a back surface disposed toward the transparent resin, wherein the back surface projects toward the light-emitting element, the transparent member has a flange portion at one side which extends outwardly, and the side surface and a portion of a front surface of the flange portion is covered by the transparent resin.

2. The light-emitting device according to claim 1, wherein at least one portion of the back surface is proximate to the light-emitting element at one point.

3. The light-emitting device according to claim 1, wherein the back surface includes a curved surface.

4. The light-emitting device according to claim 1, wherein the back surface is formed in a convex shape.

5. A light-emitting device comprising a package having a recessed portion, in which the light-emitting element is disposed, wherein the package has at least a first front surface extending at least outwardly above the recessed portion; a second front surface extending outwardly above the first front surface; and a third front surface as an outer surface of the package extending outwardly above the second front surface, and the transparent resin is continuously provided along the first front surface, the second front surface, and a back surface of the transparent member, the second front surface includes surfaces of at least three supporting base members provided above the first front surface and the back surface of the transparent member is in contact with the second front surface.

6. The light-emitting device according to claim 5, wherein the transparent member is disposed along the second front surface with at least three points of contact, and the first front surface and the second front surface each have an exposed portion disposed outwardly from respective points of contact with the transparent member.

7. The light-emitting device according to claim 5, wherein the transparent member has a flange portion at a bottom end surface that extends outwardly, and the side surface and the front surface of the flange portion contact the transparent resin.

8. The light-emitting device according to claim 7, wherein the back surface of the flange portion is parallel to and adjacent the second front surface.

9. The light-emitting device according to claim 6, wherein the outline of the second front surface is a polygonal shape with more vertexes than an outline of the transparent member.

10. The light-emitting device according to claim 9, wherein the outline of the transparent member is rounded at the points of contact.

11. The light-emitting device according to claim 5, wherein the exposed portion of the first front surface projects into a corner portion of the package.

12. The light-emitting device according to claim 6, wherein the exposed portion of the first front surface faces a corner of the second front surface.

13. The light-emitting device according to claim 6, wherein the exposed portion of the first front surface includes a portion having a rounded surface outline.

14. The light-emitting device according to claim 5, wherein:

the package is formed with a pair of lead terminals extending from a side surface, and an inner portion of the lead terminal is disposed along the outline of the first front surface.

15. The light-emitting device according to claim 14, wherein the inner portion of the lead terminal extends in two directions inside the device.

16. The light-emitting device according to claim 14, wherein a portion of the back surface of the inner portion of the lead terminal is exposed to an opening disposed in the back surface side of the package.

17. The light-emitting device according to claim 5, wherein the package includes a metal base member having a back surface that is a mount surface, the front surface of the metal base member is disposed in the recessed portion, and the light-emitting element is disposed on the front surface of the metal base member.

18. The light-emitting device according to claim 17, wherein the metal base member includes lead terminals integrally attached thereto, and an end of the metal base member projects from one side of the package.

19. The light-emitting device according to claim 17, wherein the metal base member has a first front surface exposed in the recessed portion, and a second front surface covered by the package.

20. The light-emitting device according to claim 17, wherein the, metal base member has a first recessed portion provided on the front surface of the metal base member.

21. The light-emitting device according to claim 17, wherein one end portion of the pair of lead terminals are exposed from a side surface opposite to a side surface where a portion of the metal base member is exposed, and the lead terminals are parallel and spaced apart a predetermined distance.

22. The light-emitting device according to claim 17, wherein the back surface of the package has a notch portion opening at an edge facing the metal base member.

23. The light-emitting device according to claim 5, wherein:

the light-emitting element has a pair of positive and negative terminals on a first side, the pair of terminals of the light-emitting element are connected with inner portions of the pair of the lead terminals by wires, and the top points of the wires are positioned between the first front surface and the second front surface.

24. The light-emitting device according to claim 1, wherein the transparent member includes a fluorescent material.

25. The light-emitting device according to claim 1, wherein the transparent resin has a laminated structure including at least two layers, and the fluorescent material is included in at least one of the at least two layers.

26. The light-emitting device according to claim 1, further comprising a package in which the light-emitting element is disposed, wherein the package has at least three truncated cone stands that support a back surface of the transparent member.

27. The light-emitting device according to claim 1, further comprising a package in which the light-emitting element is disposed, wherein the package has at least three hog-backed pillar stands having a shape similar to half of a cylinder that support a back surface of the transparent member.

28. A light-emitting device, comprising:

a package having a recessed portion, in which a light-emitting element is disposed, wherein the package has at least a first front surface extending at least outwardly above the recessed portion and a second front surface as an outer surface of the package extending outwardly above the first front surface, and a transparent resin is continuously provided along the first front surface, and a back surface of the transparent member, the first front surface includes surfaces of at least three supporting base members provided above the first front surface and the back surface of the transparent member is in contact with the first front surface.

* * * * *